(12) United States Patent
Uehira

(10) Patent No.: US 7,888,450 B2
(45) Date of Patent: Feb. 15, 2011

(54) LIQUID CRYSTAL POLYMER AND FILM THEREOF

(75) Inventor: Shigeki Uehira, Minami-ashigara (JP)

(73) Assignee: Fujifilm Corporation, Minato-Ku, Tokyo (JP)

( * ) Notice: Subject to any disclaimer, the term of this patent is extended or adjusted under 35 U.S.C. 154(b) by 0 days.

(21) Appl. No.: 12/407,423

(22) Filed: Mar. 19, 2009

(65) Prior Publication Data

US 2009/0240022 A1 Sep. 24, 2009

(30) Foreign Application Priority Data

Mar. 21, 2008 (JP) ............................. 2008-074639

(51) Int. Cl.
*C08G 63/06* (2006.01)
*C08G 65/38* (2006.01)

(52) U.S. Cl. ........................ 528/206; 528/271; 528/272; 528/363

(58) Field of Classification Search ................. 528/271, 528/272, 363, 206
See application file for complete search history.

(56) References Cited

U.S. PATENT DOCUMENTS

| | | | |
|---|---|---|---|
| 5,534,209 A | | 7/1996 | Moriya |
| 5,730,903 A | * | 3/1998 | Okazaki ................. 252/299.62 |
| 6,801,292 B2 | * | 10/2004 | Sato ........................... 349/182 |
| 7,201,950 B2 | * | 4/2007 | Uehira et al. ................. 428/1.1 |
| 7,273,641 B2 | * | 9/2007 | Matsuumi et al. ............ 428/1.1 |
| 7,314,654 B2 | * | 1/2008 | Uehira et al. ................. 428/1.1 |
| 2007/0281111 A1 | * | 12/2007 | Uehira et al. ................. 428/1.1 |
| 2009/0122237 A1 | * | 5/2009 | Fukagawa et al. ............. 349/96 |

FOREIGN PATENT DOCUMENTS

| | | | |
|---|---|---|---|
| JP | 5-38007 B2 | | 6/1993 |
| JP | 5-331275 A | | 12/1993 |
| JP | 7-251438 A | | 10/1995 |
| JP | 2000-326405 A | | 11/2000 |
| JP | 2001356214 | * | 2/2001 |
| JP | 2001270914 | * | 10/2001 |
| JP | 2005134722 | * | 5/2005 |
| WO | WO 00/68291 | | 11/2000 |

* cited by examiner

*Primary Examiner*—Terressa M Boykin
(74) *Attorney, Agent, or Firm*—Buchanan Ingersoll & Rooney PC

(57) ABSTRACT

A liquid crystal polymer represented by the following formula (I):

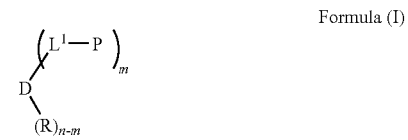

Formula (I)

wherein D represents a n-valence connecting group; n represents an integer of 3 to 20; $L^1$ represents a single bond or a bivalent connecting group; P represents a polymer having at least one ester bond and/or amide bond and having a weight-average molecular weight of 1,000 or more; m represents an integer that satisfies the relation of n≧m; R represents a hydrogen atom or a substituent; when a plurality of $L^1$, a plurality of P, or a plurality of R are present in a molecule, they may be the same or different from each other; and P and P, or P and R may bond together.

14 Claims, 1 Drawing Sheet

LIQUID CRYSTAL POLYMER AND FILM THEREOF

FIELD OF THE INVENTION

The present invention relates to a liquid crystal polymer compound having a discotic core, and a composition and a film comprising the compound.

BACKGROUND OF THE INVENTION

Recently, speeding-up of the signals, and both density growth and high multi-stratification of the patterns are becoming necessary in electronic circuit boards of information and telecommunications equipments represented by computers and portable devices and electronic circuit boards of automobile-related equipments represented by ITS (Intelligent Transport System). Accordingly, upgrading of frequency (100 MHz or more) in fields such as information and telecommunications equipments is progressing. The property of low-dielectric loss is required to the film that is used for condensers, antenna modules and the like that are contained in these equipments. As one of proposals that dissolve the aforementioned demands, there is a film made of a liquid crystal polymer (liquid crystal polymer film).

The liquid crystal polymer film has a lot of advantages such as low water absorption and good dimensional stability in addition to the low-dielectric loss. However, the film has the following problems: the film is very easily oriented and has a large anisotropic nature (a difference between a TD direction and a MD direction) of the film properties. In order to dissolve the problems, particular methods for film production are proposed (see, for example, JP-A-2000-326405 ("JP-A" means unexamined published Japanese patent application) and JP-A-7-251438). However, these methods have disadvantages in consideration of very strict production condition and complicate operation. In addition, when a thin film is produced, it is very difficult to keep flatness of the film.

Various methods are used to dissolve the anisotropic nature at the time of film formation (see, for example, JP-B-5-38007 ("JP-B" means examined Japanese patent publication), JP-A-5-331275, WO00/68291). However, liquid crystal polymers that are obtained by these methods still have a problem in consideration of a large reduction in fluidity. From consideration of insufficiency of effect on reduction of anisotropy, there is a need to improve a liquid crystal polymer that is used as a resin for film production.

SUMMARY OF THE INVENTION

The present invention resides in a liquid crystal polymer represented by the following formula (I):

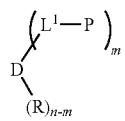

Formula (I)

wherein D represents a n-valence connecting group; n represents an integer of 3 to 20; $L^1$ represents a single bond or a bivalent connecting group; P represents a polymer having at least one ester bond and/or amide bond and having a weight-average molecular weight of 1,000 or more; m represents an integer that satisfies the relation of n≧m; R represents a hydrogen atom or a substituent; when a plurality of $L^1$, a plurality of P, or a plurality of R are present in a molecule, they may be the same or different from each other; and P and P, or P and R may bond together.

The present invention also resides in a composition containing the aforementioned liquid crystal polymer.

The present invention also resides in a film containing the aforementioned liquid crystal polymer.

Other and further features and advantages of the invention will appear more fully from the following description, appropriately referring to the accompanying drawings.

DETAILED DESCRIPTION OF THE INVENTION

Figure 1:
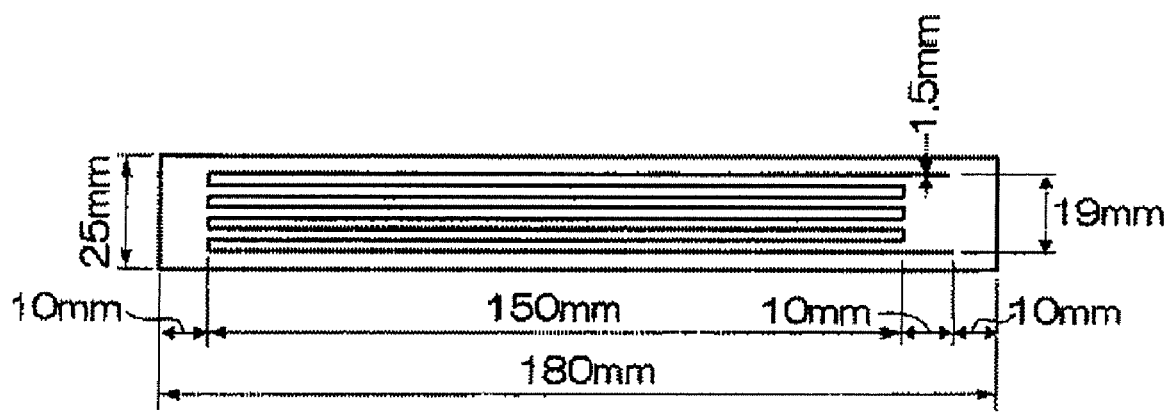
FIG. 1 is a plan view showing a pattern for evaluation of flexibility of the flexible board.

According to the present invention, there is provided the following means.

<1> A liquid crystal polymer represented by the following formula (I):

Formula (I)

wherein D represents a n-valence connecting group; n represents an integer of 3 to 20; $L^1$ represents a single bond or a bivalent connecting group; P represents a polymer having at least one ester bond and/or amide bond and having a weight-average molecular weight of 1,000 or more; m represents an integer that satisfies the relation of n≧m; R represents a hydrogen atom or a substituent; when a plurality of $L^1$, a plurality of P, or a plurality of R are present in a molecule, they may be the same or different from each other; and P and P, or P and R may bond together.

<2> The liquid crystal polymer as described in <1>, wherein P in formula (I) is a polymer having at least one recurring unit selected from the recurring unit group set forth below and having at least one ester bond and/or amide bond:

(Recurring Unit Group)

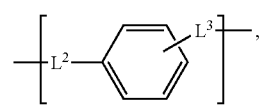

Formula (P1)

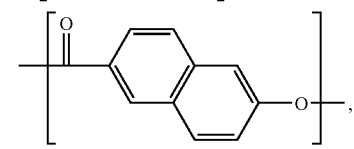

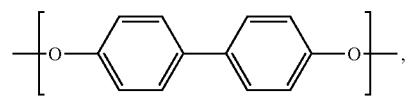

Formula (P2)

-continued

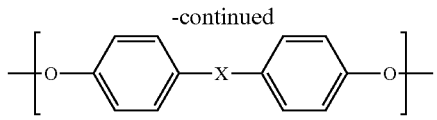

wherein, in formula (P1), $L^2$ and $L^3$ each independently represents a connecting group selected from the group consisting of —O—, —NH—, —CO—, —COO(CH$_2$)$_2$O—, —COO(CH$_2$)$_4$O—, and —COO(CH$_2$)$_2$CH(CH$_3$)O—; the location of $L^3$ is a para-position or a meta-position, relative to $L^2$; and wherein, in formula (P2), X represents a connecting group selected from the group consisting of —O—, —C(CH$_3$)$_2$—, and —SO$_2$—.

<3> The liquid crystal polymer as described in <1> or <2>, wherein R in the formula (I) is selected from the group consisting of a hydrogen atom, a hydroxyl group, a carboxyl group, an acyloxy group, an alkoxycarbonyl group, an amino group, and an acylamino group.

<4> The liquid crystal polymer as described in any one of <1> to <3>, wherein $L^1$ in the formula (I) is any one of the following bivalent connecting groups:

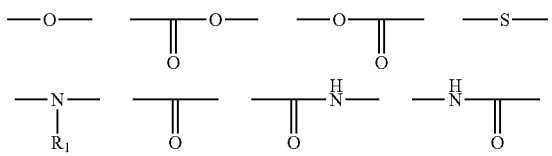

wherein $R^1$ represents a hydroxyl group, a methyl group, or an ethyl group.

<5> The liquid crystal polymer as described in any one of <1> to <4>, wherein D in the formula (I) is a connecting group represented by any one of the following formulae (D-I) to (D-III):

Formula (D-I)

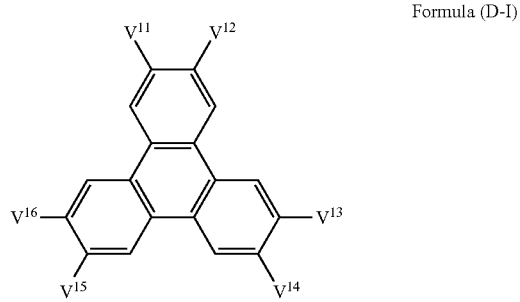

Formula (D-II)

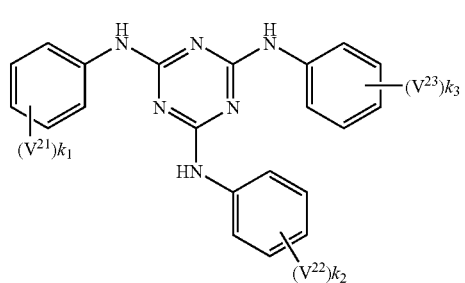

Formula (D-III)

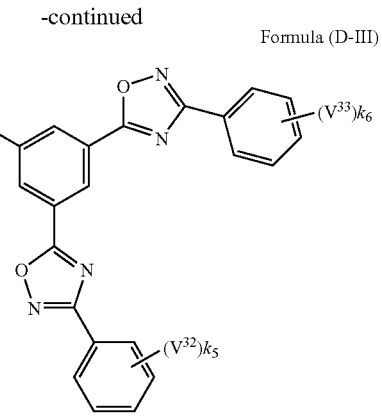

wherein, in formula (D-I), $V^{11}$ to $V^{16}$ each independently represents a -$L^1$-P group or —R group in the polymer of formula (I), a hydroxyl group, or an acyloxy group; and the connecting group represented by formula (D-I) has $m^1$ number of the -$L^1$—P group in the polymer of formula (I) and has ($n^1$-$m^1$) number of the —R group in the polymer of formula (I), in which $n^1$ represents an integer of 3 to 6, and $m^1$ represents an integer that satisfies the relation of $n^1 \geq m^1$;

wherein, in formula (D-II), $V^{21}$ to $V^{23}$ each independently represents a -$L^1$—P group or —R group in the polymer of formula (I), a hydroxyl group, an acyloxy group, an alkoxycarbonyl group, an amino group, or an acylamino group; $k_1$, $k_2$, and $k_3$ each independently represents an integer of 0 to 5; and the connecting group represented by formula (D-II) has $m^2$ number of the -$L^1$—P group in the polymer of formula (I) and has ($n^2$-$m^2$) number of the —R group in the polymer of formula (I), in which $n^2$ represents an integer of 3 to 15, and $m^2$ represents an integer that satisfies the relation of $n^2 \geq m^2$;

wherein, in formula (D-III), $V^{31}$ to $V^{33}$ each independently represents a -$L^1$—P group or —R group in the polymer of formula (I), a hydroxyl group, an acyloxy group, an alkoxycarbonyl group, an amino group, or an acylamino group; $k_4$, $k_5$, and $k_6$ each independently represents an integer of 0 to 5; and the connecting group represented by formula (D-III) has $m^3$ number of the -$L^1$-P group in the polymer of formula (I) and has ($n^3$-$m^3$) number of the —R group in the polymer of formula (I), in which $n^3$ represents an integer of 3 to 15, and $m^3$ represents an integer that satisfies the relation of $n^3 \geq m^3$.

<6> A composition containing the liquid crystal polymer as described in any one of <1> to <5>.

<7> A film containing the liquid crystal polymer as described in any one of <1> to <5>.

The present invention will be explained in detail below.

The following explanation of constitutional elements is sometimes described in accordance with representative embodiments of the present invention. However, the present invention is not limited to such the embodiments. It is noted that the numerical range expressed by "to" in the present specification means a range embracing the numerical numbers described in front and in rear of "to".

<Liquid Crystal Polymer>

The present invention is a liquid crystal polymer represented by the following formula (I):

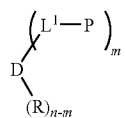

Formula (I)

wherein D represents a n-valence connecting group; n represents an integer of 3 to 20; $L^1$ represents a single bond or a bivalent connecting group; P represents a polymer having at least one ester bond and/or an amide bond and having a weight-average molecular weight of 1,000 or more; m represents an integer that satisfies the relation of n≧m; R represents a hydrogen atom or a substituent; when a plurality of $L^1$, a plurality of P, or a plurality of R are present in a molecule, they may be the same or different from each other; and P and P, or P and R may bond together.

In the formula (I), D represents an n-valence connecting group. It is preferable that D is a rigid connecting group containing an aromatic ring. The term "rigid connecting group" means a connecting group having a structure that is difficult to change from a certain steric structure to other steric structures. Examples of the rigid connecting group having an aromatic ring include discotic cores that are well known as molecular structures of the discotic liquid crystalline molecules. The discotic liquid crystals are described in many references (for example, C. Destrade et al., *Mol. Crysr. Liq. Cryst.*, Vol. 71, p. 111 (1981); Nippon Kagaku Kai (The Chemical Society of Japan), "*Kikan Kagaku Sosetsu, No.22, Ekisyo no Kagaku* (Quaternary Chemical Review, No. 22, Chemistry of Liquid crystal)", Chapter 5 and Chapter 10, Subchapter 2 (1994); B. Kohne et al., *Angew. Chem. Soc. Comm.*, p. 1794 (1985); J. Zhanget et al., *J. Am. Chem. Soc.*, Vol. 116, p. 2655 (1994)).

It is preferable that D is a connecting group represented by any one of the following formulae (D-I) to (D-III).

Formula (D-I)

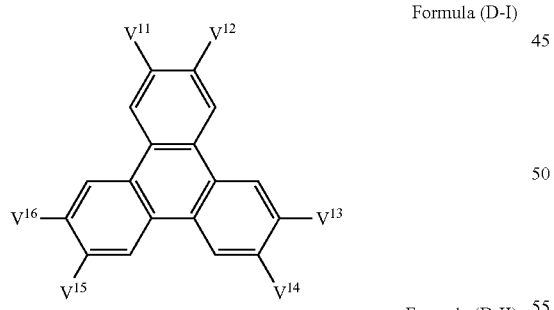

Formula (D-II)

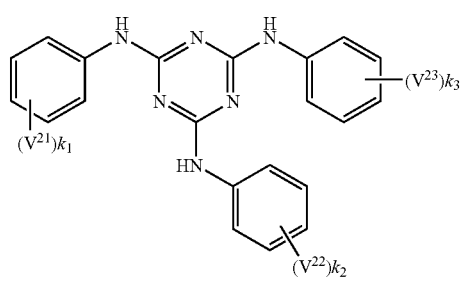

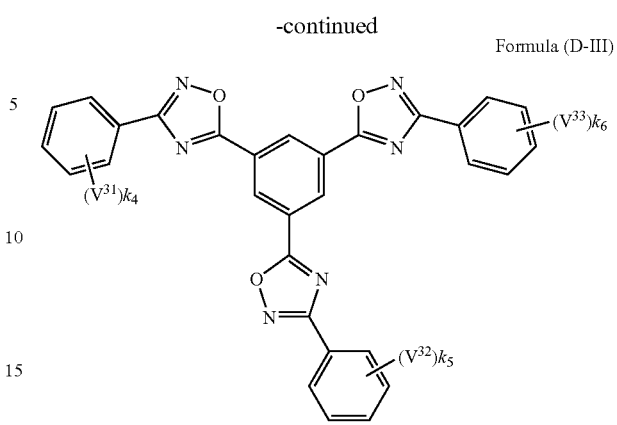

Formula (D-III)

In formula (D-I), $V^{11}$ to $V^{16}$ each independently represents a -$L^1$-P group or —R group in the polymer of formula (I), a hydroxyl group, an acyloxy group, with the proviso that the connecting group represented by the formula (D-I) has m1 number of the -$L^1$-P group in the polymer of formula (I) and has ($n^1$-$m^1$) number of the —R group in the polymer of formula (I), wherein $n^1$ represents an integer of 3 to 6, and $m^1$ represents an integer that satisfies the relation of $n^1$≧$m^1$.

In formula (D-II), $V^{21}$ to $V^{23}$ each independently represents a -$L^1$-P group or —R group in the polymer of formula (I), a hydroxyl group, an acyloxy group, an alkoxycarbonyl group, an amino group, or an acylamino group. $k_1$, $k_2$, and $k_3$ each independently represents an integer of 0 to 5, with the proviso that the connecting group represented by the formula (D-II) has $m^2$ number of the -$L^1$-P group in the polymer of formula (I) and has ($n^2$-$m^2$) number of the —R group in the polymer of formula (I), wherein $n^2$ represents an integer of 3 to 15, and $m^2$ represents an integer that satisfies the relation of $n^2$≧$m^2$.

In formula (D-III), $V^{31}$ to $V^{33}$ each independently represents a -$L^1$-P group or —R group in the polymer of formula (I), a hydroxyl group, an acyloxy group, an alkoxycarbonyl group, an amino group, or an acylamino group. $k_4$, $k_5$, and $k_6$ each independently represents an integer of 0 to 5, with the proviso that the connecting group represented by the formula (D-III) has $m^3$ number of the -$L^1$-P group in the polymer of formula (I) and has ($n^3$-$m^3$) number of the —R group in the polymer of formula (I), wherein $n^3$ represents an integer of 3 to 15, and $m^3$ represents an integer that satisfies the relation of $n^3$≧$m^3$.

Specific examples of the connecting group D are shown below. However, the present invention is not limited to these compounds. In the following formulae, Y represents a -$L^1$— group or —R group in the polymer of formula (I).

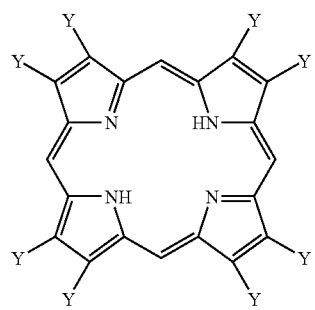

(D1)

-continued
(D2)
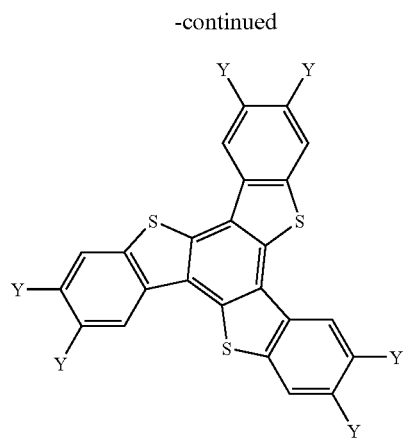
(D3)
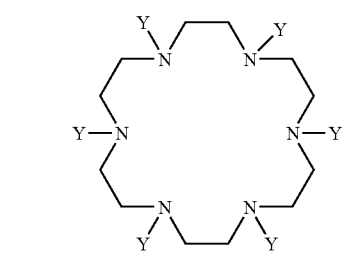
(D4)
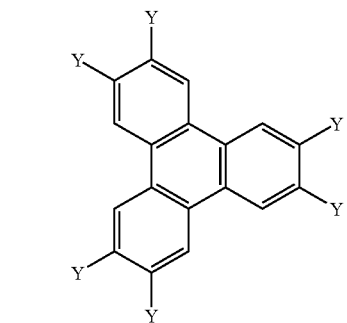
(D5)
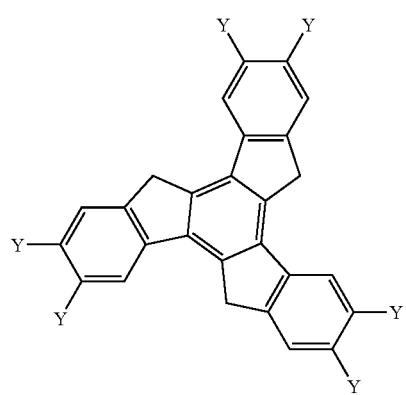
-continued
(D6)
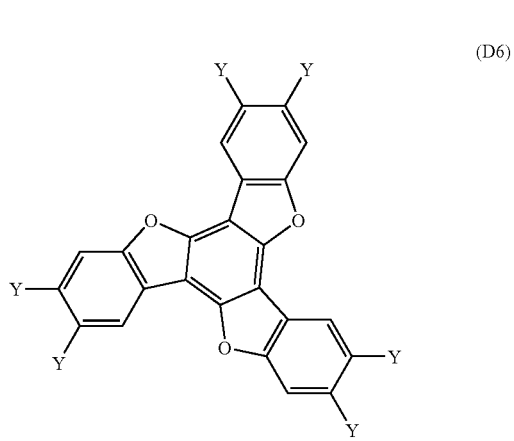
(D7)
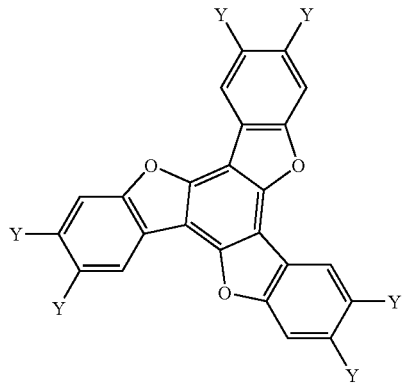
(D8)
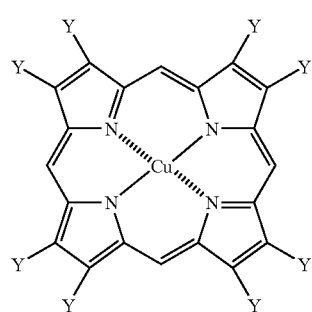
(D9)
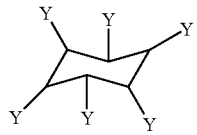
(D10)
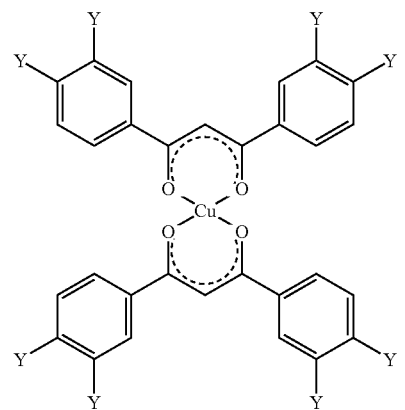

-continued
(D11)
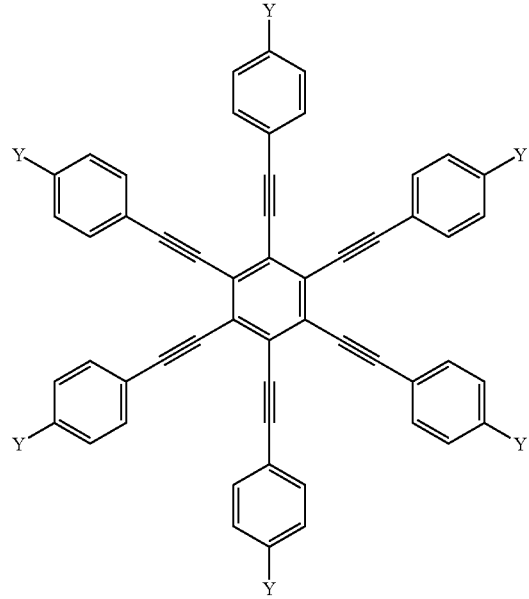
(D13)
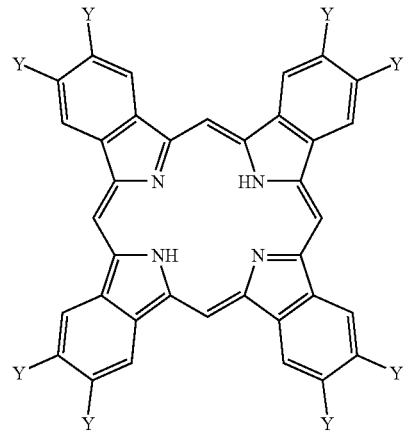
(D14)
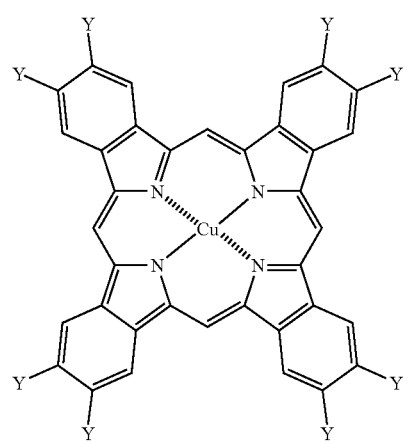
(D12)
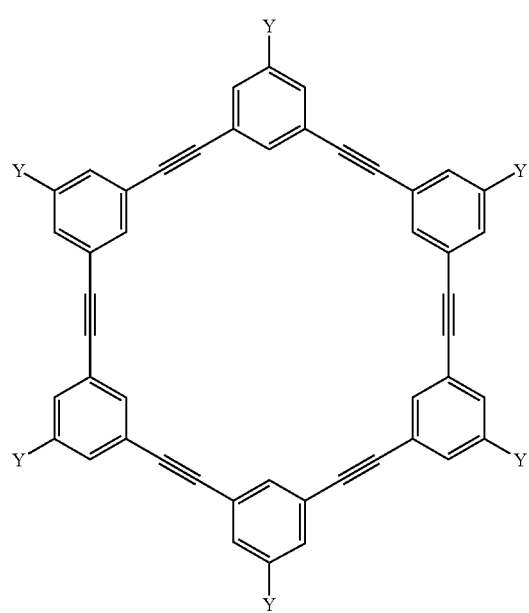
(D15)
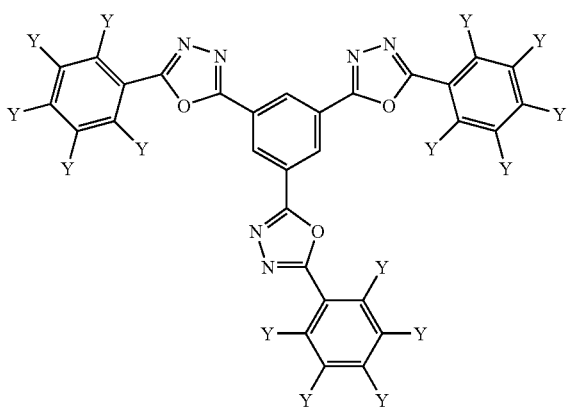

(D16)
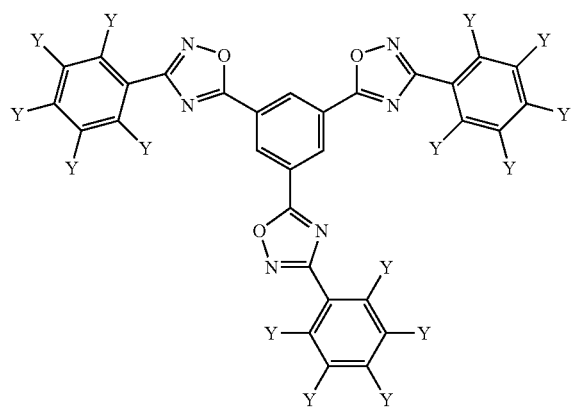
(D17)
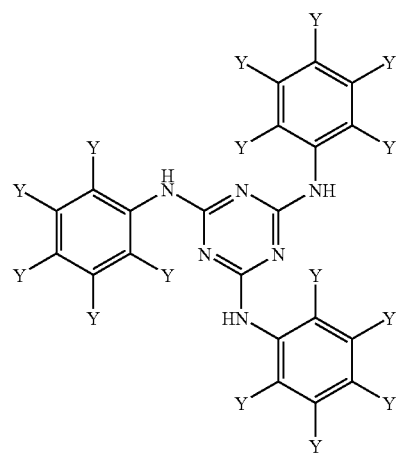
Of these examples of the connecting group D, (D4), (D16), or (D17) is especially preferable.
As more preferable connecting groups, (D4), and the following (D16-1) to (D16-5), and (D17-1) to (D17-5) are exemplified.
(D-16-1)
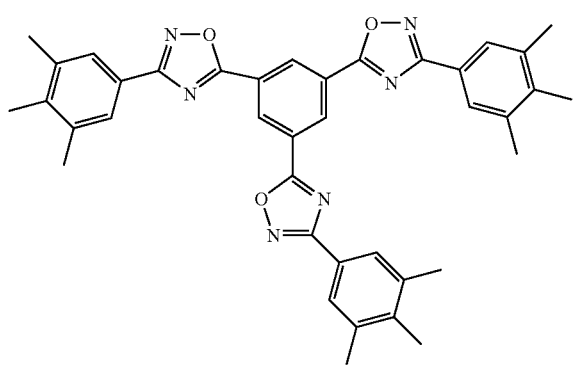
(D-16-2)
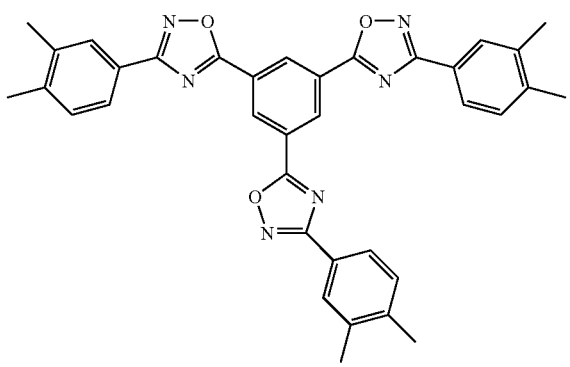
(D-16-3)
(D-16-4)
(D-16-5)
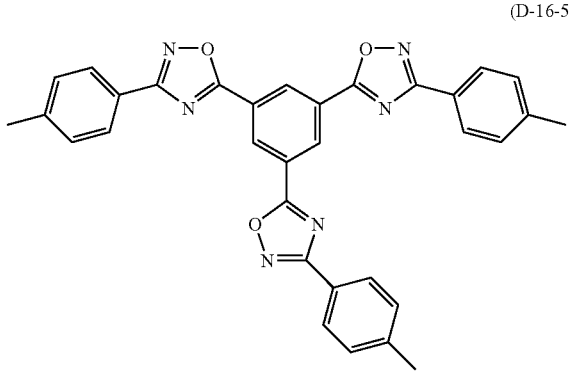

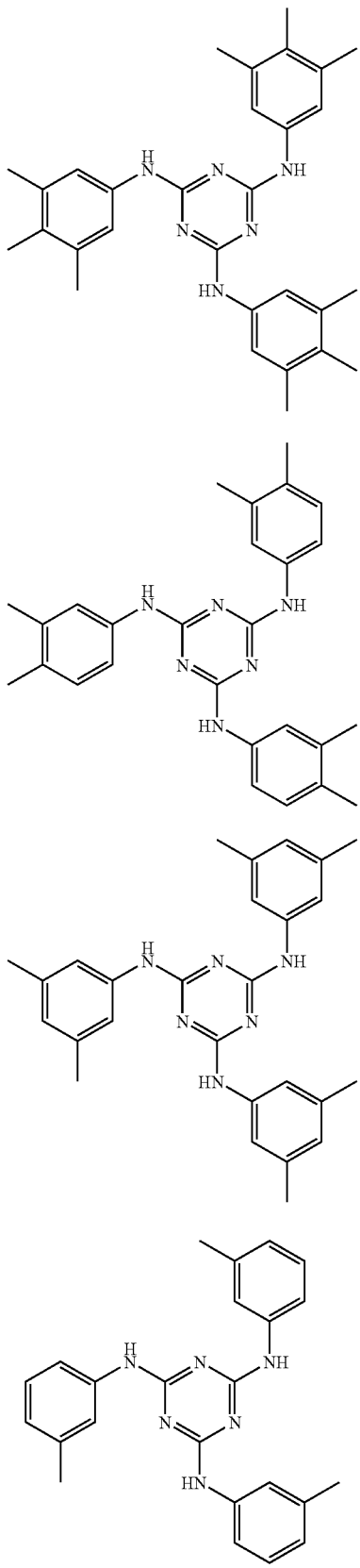

(D-17-1)
(D-17-2)
(D-17-3)
(D-17-4)

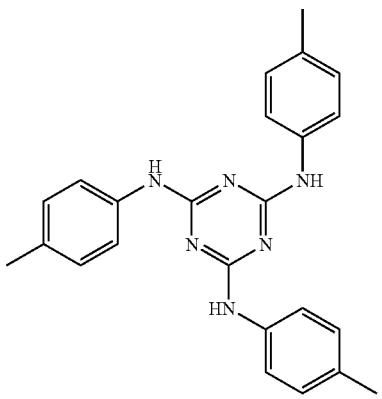

(D-17-5)

There is no particular limitation on the position of the connecting group D in a molecular chain of the liquid crystal polymer represented by the formula (I), as long as the connecting group is preset in the polymer molecular chain.

In the formula (I), n represents an integer of 3 to 20. n is preferably from 3 to 10, and more preferably from 3 to 6.

m represents an integer that satisfies the relation of n≧m. It is preferable that n-m is 0, 1, or 2.

In the formula (I), $L^1$ represents a single bond, or a bivalent connecting group. The bivalent connecting group is preferably any one of the following groups.

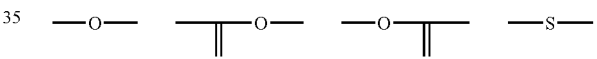
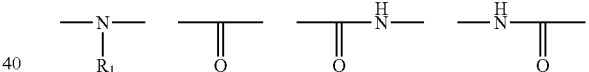

In the above, $R^1$ represents a hydroxyl group, a methyl group, or an ethyl group.

In the formula (I), P represents a polymer having at least one ester bond and/or an amide bond, and having a weight-average molecular weight of 1,000 or more.

Preferable examples of the polymer include a main chain type liquid crystal polymer.

The main chain type liquid crystal polymer is not particularly limited, but can be properly selected in accordance with its purpose. For example, there can be exemplified polymers having, as a recurring unit, a basic (fundamental) skeleton containing at least a cyclic group. Specifically, suitable examples of the polymer include those having, as a recurring unit, a basic skeleton containing a cyclic group, a connecting group, a functional group, and a spacer group.

The weight-average molecular weight of liquid crystal polymer P is preferably in the range of 10,000 to 200,000, and more preferably in the range of 20,000 to 100,000.

It is preferable that the liquid crystal polymer P is composed of at least one recurring unit selected from the recurring unit group set forth below and having at least one ester bond and/or an amide bond.

(Recurring Unit Group)

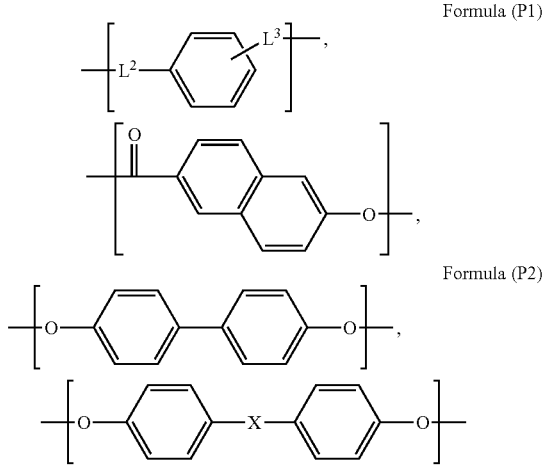

In formula (P1), $L^2$ and $L^3$ each independently represents a connecting group selected from the group consisting of —O—, —NH—, —CO—, —COO(CH$_2$)$_2$O—, —COO(CH$_2$)$_4$O—, and —COO(CH$_2$)$_2$CH(CH$_3$)O—. The location of $L^3$ is a para-position or a meta-position relative to $L^2$.

In formula (P2), X represents a connecting group selected from the group consisting of —O—, —C(CH$_3$)$_2$—, and —SO$_2$—.

Further, the liquid crystal polymer may be used singly or in combination of two or more kinds of polymers. Of these polymers, polyesters or polyamides are preferable from a viewpoint that a highly heat-resistant film can be easily obtained; and aromatic polyesters or aromatic polyamides are especially preferable, and aromatic polyesters are more preferable.

The aromatic polyesters are not particularly limited, but can be properly selected in accordance with its purpose. For example, there can be suitably exemplified those containing, as a monomer component, at least one compound selected from the group consisting of aromatic diols, aromatic dicarboxylic acids, and hydroxycarboxylic acids, as shown in Table 1.

TABLE 1

| Aromatic diol | Aromatic dicarboxylic acid | Hydroxy carboxylic acid |
|---|---|---|

TABLE 1-continued

| Aromatic diol | Aromatic dicarboxylic acid | Hydroxy carboxylic acid |
|---|---|---|
| HO—⟨⟩—X—⟨⟩—OH  (X = CH₂, C(CH₃)₂, SO₂) | HOOC—[bicyclo]—COOH | |
| HO—⟨⟩—OH (resorcinol) | HOOC—⟨⟩—COOH (isophthalic) | |
| HO—[anthraquinone]—OH | HOOC—⟨⟩—CH₂COOH | |
| | HOOC—⟨⟩—OCH₂CH₂O—⟨⟩—COOH | |
| | HOOC—[naphthalene]—COOH | |

As the aromatic polyesters, those containing the structure composed of two recurring units represented by the following formula (A) are especially preferable in consideration of heat resistance.

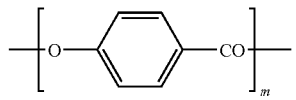

Formula A

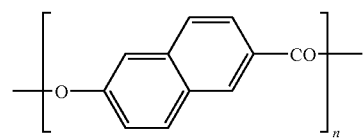

In the formula (A), m and n represent relative proportions (molar ratio) of the recurring unit. The ratio of m:n is not particularly limited, but can be properly selected in accordance with its purpose.

Further, as the aromatic polyesters, those containing structures exemplified below are also preferable in addition to the aromatic polyesters containing the structures represented by the formula (A).

In the description of the present specification, the square bracket indicates a recurring unit. There is no particular limitation, as long as the recurring units shown below are contained in a main chain of the liquid crystal polymer. Therefore, the recurring units may be contained at random, or as a block. A polymer shown by a plurality of recurring unit means to embrace all the compounds in which individual recurring unit has its arbitrary proportion, unless otherwise indicated. However, in order to obtain a required molecular weight, it is preferable that a ratio of a total mole of the end —O— groups and a total mole of the end —CO— groups, in the recurring units that constitute a main chain, is within the range of at least 1±0.02, and preferably 1±0.01.

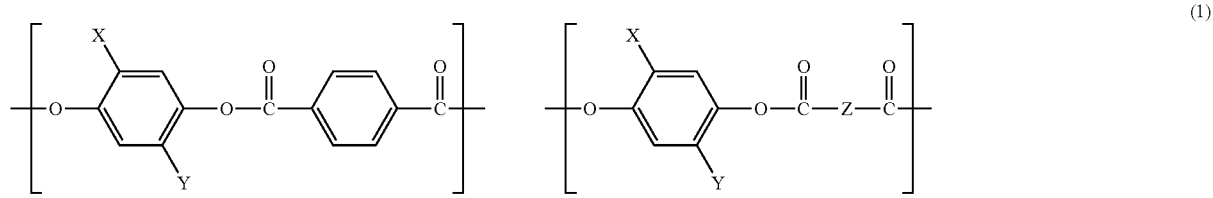
(1)
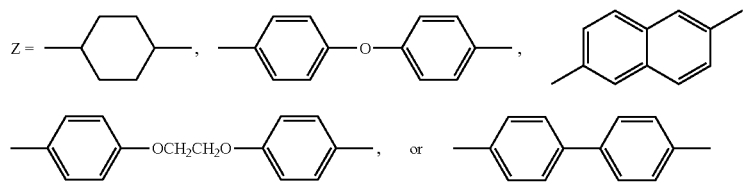
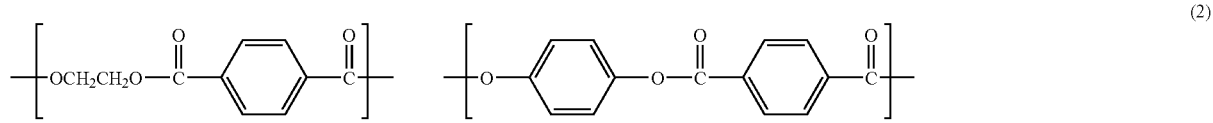
(2)
(3)
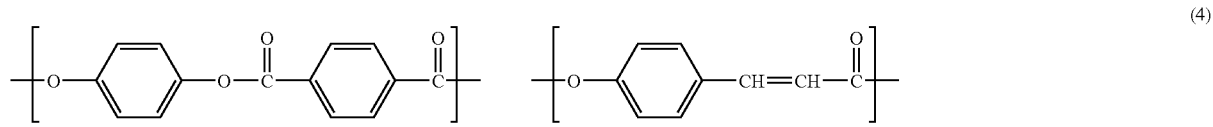
(4)
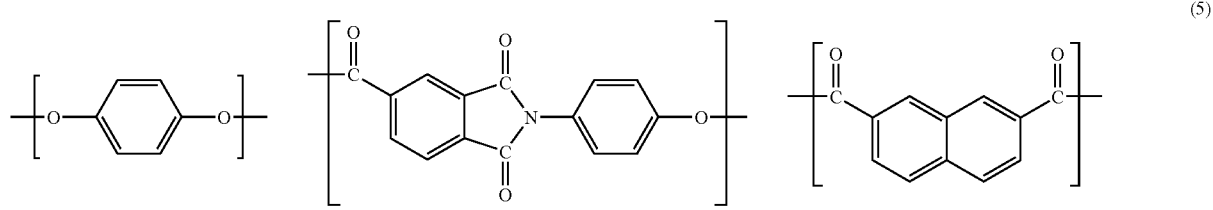
(5)
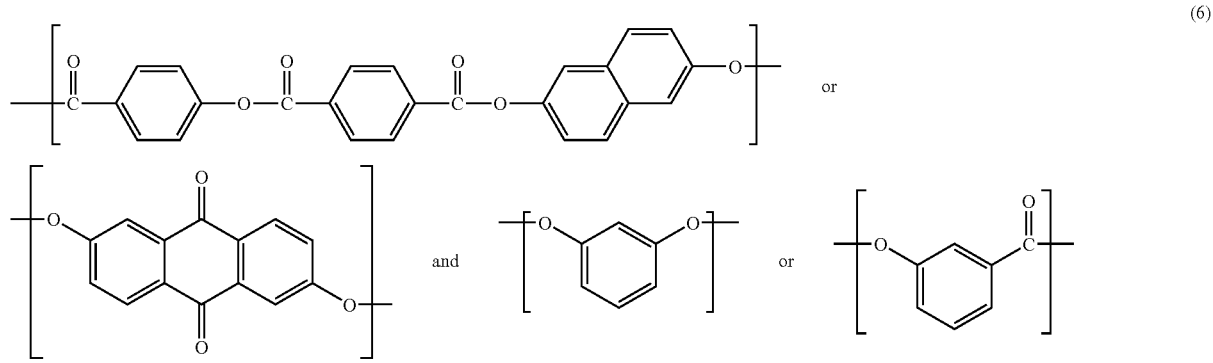
(6)
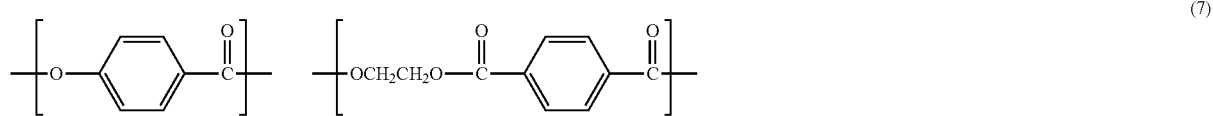
(7)

-continued
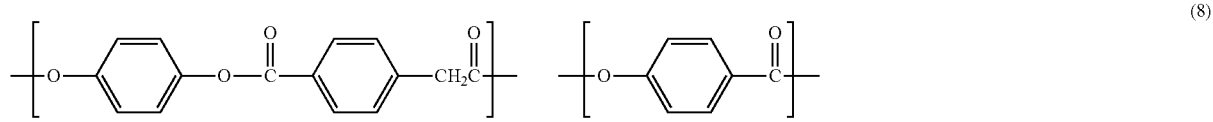
(8)
(9)
X = —Cl, —Br, —CH₃, etc.
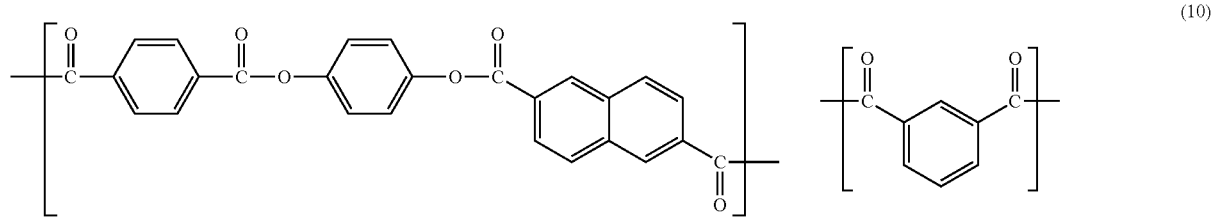
(10)
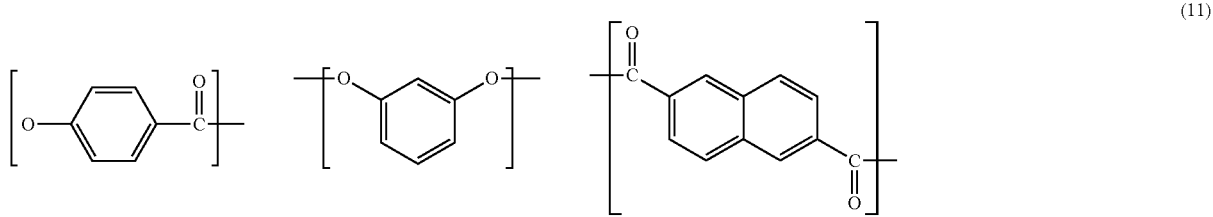
(11)
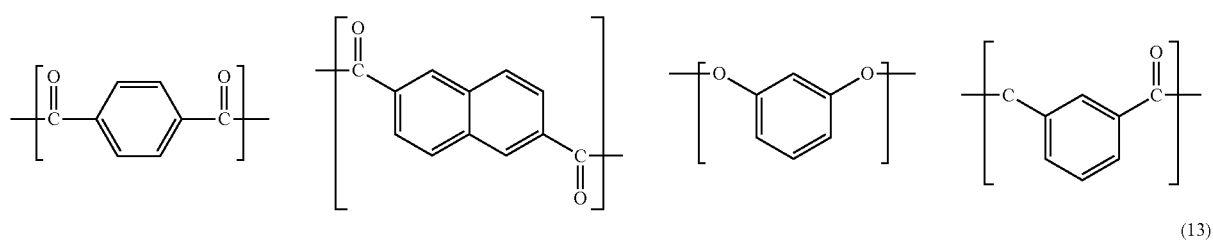
(12)
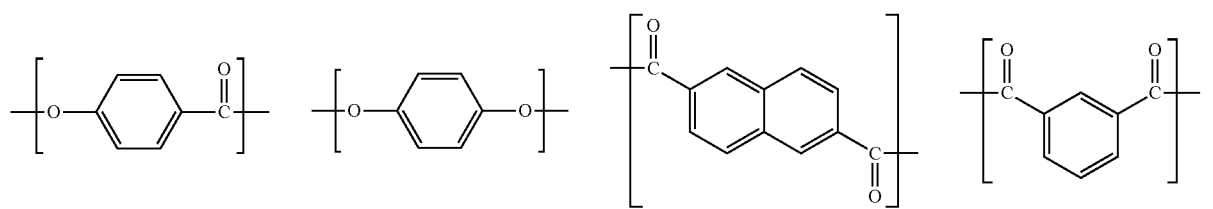
(13)
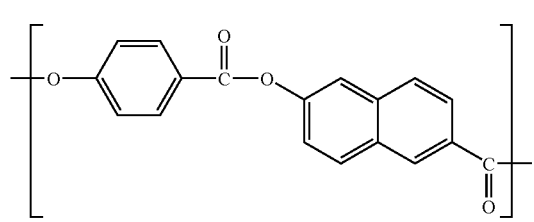
(14)

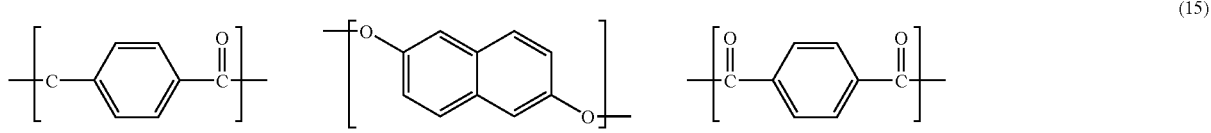
(15)

(16)

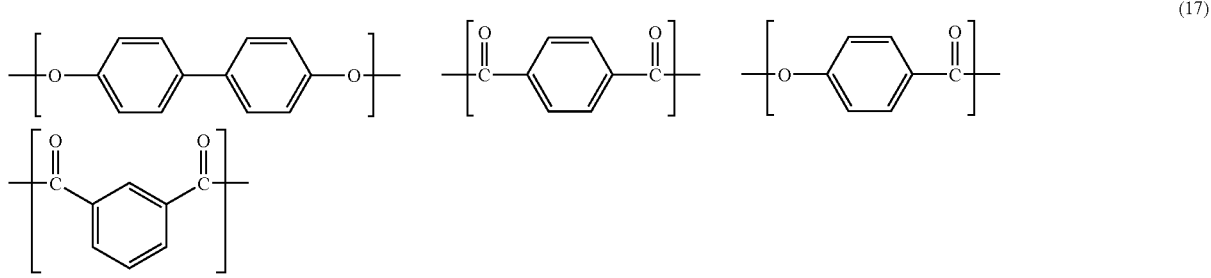
(17)

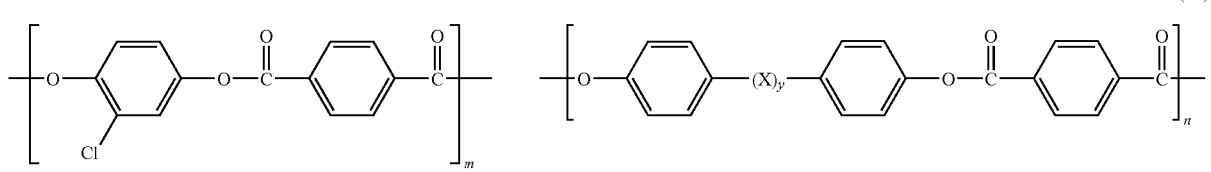
(18)

m and n each represents a polymerization degree. X represents —C(CH$_3$)$_2$—, —CH$_2$—, —O—, —S— or —SO$_2$—. y represents 0 or 1.

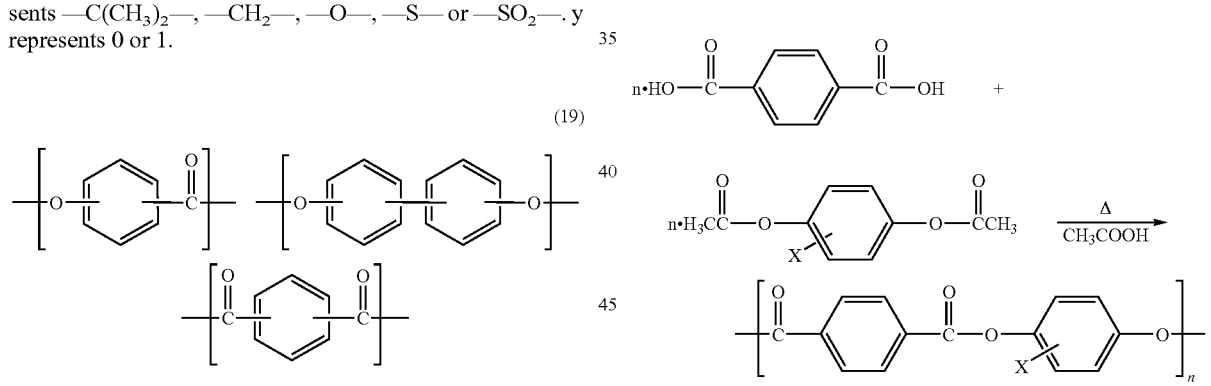
(19)

Examples of the synthesis method for the main chain type liquid crystal polymer P include a synthetic method as shown by the following scheme.

$$n \cdot HO-\overset{O}{\underset{\|}{C}}-\text{C}_6\text{H}_4-\overset{O}{\underset{\|}{C}}-OH \quad +$$

$$n \cdot H_3C\overset{O}{\underset{\|}{C}}-O-\text{Ar}(X)-O-\overset{O}{\underset{\|}{C}}CH_3 \xrightarrow[\text{CH}_3\text{COOH}]{\Delta}$$

$$\left[-\overset{O}{\underset{\|}{C}}-\text{C}_6\text{H}_4-\overset{O}{\underset{\|}{C}}-O-\text{Ar}(X)-O-\right]_n$$

n represents an integer. X represents a hydrogen atom, a halogen atom, or a hydrocarbon group.

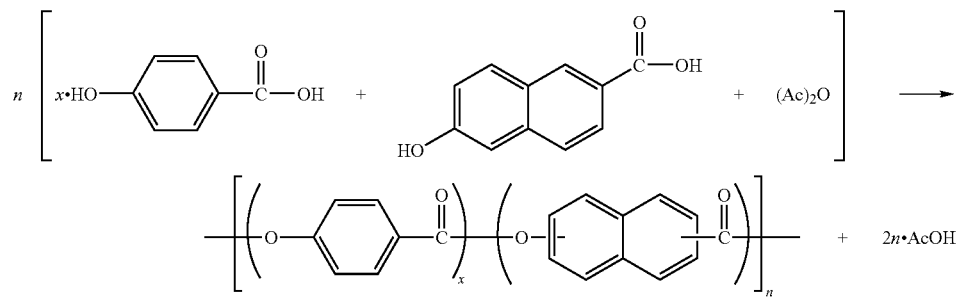

Ac represents an acetyl group. x and n each represents an integer.

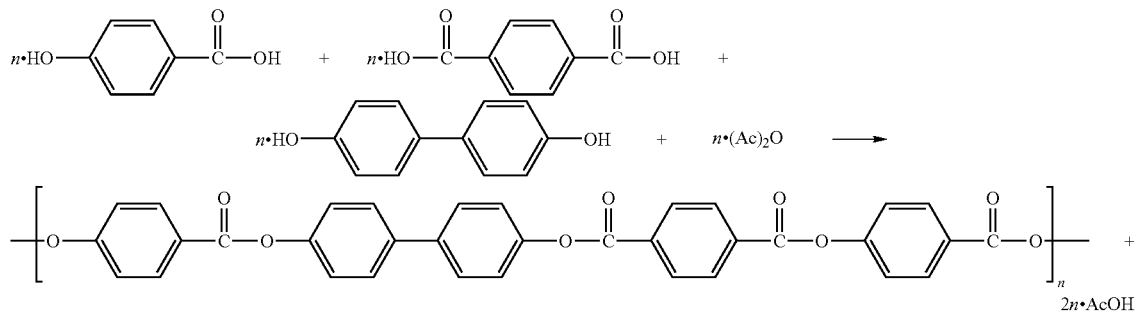

Ac represents an acetyl group. n represents an integer.

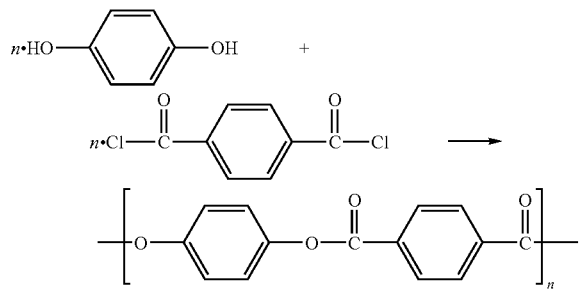

n represents an integer.

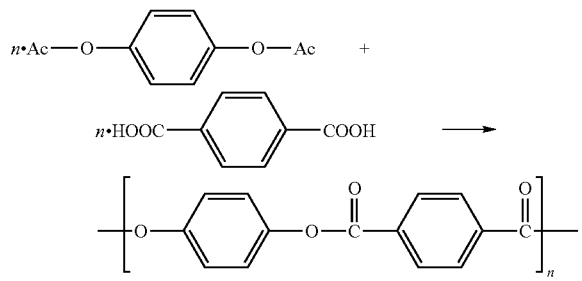

Ac represents an acetyl group. n represents an integer.

The liquid crystal polymer of the present invention is formed by bonding with the aforementioned main chain type liquid crystal polymer. Accordingly, the liquid crystal polymer of formula (I) of the present invention can be synthesized by adding a compound capable of forming a n-valence connecting group D at the time when the main chain type liquid crystal polymer is synthesized, as described, for example, in JP-A-2002-371127.

In the formula (I), R represents a hydrogen atom or a substituent.

The substituent is preferably a halogen atom (e.g., fluorine, chlorine, bromine, iodine), an alkyl group (preferably a straight-chain or branched-chain alkyl group having a carbon number of 1 to 30, e.g., methyl, ethyl, n-propyl, isopropyl, tert-butyl, n-octyl, 2-ethylhexyl), a cycloalkyl group (preferably a substituted or unsubstituted cycloalkyl group having a carbon number of 3 to 30, e.g., cyclohexyl, cyclopentyl, 4-n-dodecylcyclohexyl), a bicycloalkyl group (preferably a substituted or unsubstituted bicycloalkyl group having a carbon number of 5 to 30, that is, a monovalent group obtained by removing one hydrogen atom from a bicycloalkane having a carbon number of 5 to 30; e.g., bicyclo[1,2,2]heptan-2-yl, bicyclo[2,2,2]octan-3-yl), an alkenyl group (preferably a substituted or unsubstituted alkenyl group having a carbon number of 2 to 30, e.g., vinyl, allyl), a cycloalkenyl group (preferably a substituted or unsubstituted cycloalkenyl group having a carbon number of 3 to 30, that is, a monovalent group obtained by removing one hydrogen atom from a cycloalkene having a carbon number of 3 to 30; e.g., 2-cyclopenten-1-yl, 2-cyclohexen-1-yl), a bicycloalkenyl group (a substituted or unsubstituted bicycloalkenyl group, preferably a substituted or unsubstituted bicycloalkenyl group having a carbon number of 5 to 30, that is, a monovalent group obtained by removing one hydrogen atom from a bicycloalkene having one double bond; e.g., bicyclo[2,2,1]hept-2-en-1-yl, bicyclo[2,2,2]oct-2-en-4-yl), an alkynyl group (preferably a substituted or unsubstituted alkynyl group having a carbon number of 2 to 30, e.g., ethynyl, propargyl), an aryl group (preferably a substituted or unsubstituted aryl group having a carbon number of 6 to 30, e.g., phenyl, p-tolyl, naphthyl), a heterocyclic group (preferably a monovalent group obtained by removing one hydrogen atom from a 5- or 6-membered substituted or unsubstituted, aromatic or non-aromatic heterocyclic compound, more preferably a 5- or 6-membered aromatic heterocyclic group having a carbon number of 3 to 30; e.g., 2-furyl, 2-thienyl, 2-pyrimidinyl, 2-benzothiazolyl), a cyano group, a nitro group, an alkoxy group (preferably a substituted or unsubstituted alkoxy group having a carbon number of 1 to 30, e.g., methoxy, ethoxy, isopropoxy, tert-butoxy, n-octyloxy, 2-methoxyethoxy), an aryloxy group (preferably a substituted or unsubstituted aryloxy group having a carbon number of 6 to 30, e.g., phenoxy, 2-methylphenoxy, 4-tert-butylphenoxy, 3-nitrophenoxy, 2-tetradecanoylaminophenoxy), a silyloxy group (preferably a silyloxy group having a carbon number of 3 to 20, e.g., trimethylsilyloxy, tert-butyldimethylsilyloxy), a heterocyclic oxy group (preferably a substituted or unsubstituted heterocyclic oxy group having a carbon number of 2 to 30, e.g., 1-phenyltetrazol-5-oxy, 2-tetrahydropyranyloxy), an acyloxy group (preferably a formyloxy group, a substituted or unsubstituted alkylcarbonyloxy group having a carbon number of 2 to 30, or a substituted or unsubstituted arylcarbonyloxy group having a carbon number of 6 to 30, e.g., formyloxy, acetyloxy, pivaloyloxy, stearoyloxy, benzoyloxy, p-methoxyphenylcarbonyloxy), a carbmoyloxy group (preferably a substituted or unsubstituted carbamoyloxy group having a carbon umber of 1 to 30, e.g., N,N-dimethylcarbmoyloxy, N,N-diethylcarbamoyloxy, morpholinocarbonyloxy, N,N-di-n-octylaminocarbonyloxy, N-n-octylcarbamoyloxy), an alkoxycarbonyloxy group (preferably a substituted or unsubstituted alkoxycarbonyloxy group having a carbon number of 2 to 30, e.g., methoxycarbonyloxy, ethoxycarbonyloxy, tert-butoxycarbonyloxy, n-octylcarbonyloxy), an aryloxycarbonyloxy group (preferably a substituted or unsubstituted aryloxycarbonyloxy group having a carbon number of 7 to 30, e.g., phenoxycarbonyloxy, p-methoxyphenoxycarbonyloxy, p-n-hexadecyloxyphenoxycarbonyloxy), an acylamino group (preferably a formylamino group, a substituted or unsubstituted alkylcarbonylamino group having a carbon number of 1 to 30, or a substituted or unsubstituted arylcarbonylamino group having a carbon number of 6 to 30, e.g., formylamino, acetylamino, pivaloylamino, lauroylamino, benzoylamino), an aminocarbonylamino group (preferably a substituted or unsubstituted aminocarbonylamino group having a carbon number of 1 to 30, e.g., carbamoylamino, N,N-dimethylaminocarbonylamino, N,N-diethylaminocarbonylamino, morpholinocarbonylamino), an alkoxycarbonylamino group (preferably a substituted or unsubstituted alkoxy-carbonylamino group having a carbon number of 2 to 30, e.g., methoxycarbonylamino, ethoxycarbonylamino, tert-butoxycarbonylamino, n-octadecyloxycarbonylamino, N-methyl-methoxycarbonylamino), an aryloxycarbonylamino group (preferably a substituted or unsubstituted aryloxycarbonylamino group having a carbon number of 7 to 30, e.g., phenoxycarbonylamino, p-chlorophenoxycarbonylamino, m-n-octyloxyphenoxycarbonylamino), a sulfamoylamino group (preferably a substituted or unsubstituted sulfamoylamino group having a carbon number of 0 to 30, e.g., sulfamoylamino, N,N-dimethylaminosulfonylamino, N-n-octylaminosulfonylamino), an alkyl- or aryl-sulfonylamino group (preferably a substituted or unsubstituted alkylsulfonylamino group having a carbon number of 1 to 30, or a substituted or unsubstituted arylsulfonylamino group having a carbon number of 6 to 30, e.g., methylsulfonylamino, butylsulfonylamino, phenylsulfonylamino, 2,3,5-trichlorophenylsulfonylamino, p-methylphenylsulfonylamino), a mercapto group, an alkylthio group (preferably a substituted or unsubstituted alkylthio group having a carbon number of 1 to 30, e.g., methylthio, ethylthio, n-hexadecylthio), an arylthio group (preferably a substituted or unsubstituted arylthio group having a carbon number of 6 to 30, e.g., phenylthio, p-chlorophenylthio, m-methoxyphenylthio), a heterocyclic thio group (preferably a substituted or unsubstituted heterocyclic thio group having a carbon number of 2 to 30, e.g., 2-benzothiazolylthio, 1-phenyltetrazol-5-ylthio), a sulfamoyl group (preferably a substituted or unsubstituted sulfamoyl group having a carbon number of 0 to 30, e.g., N-ethylsulfamoyl, N-(3-dodecyloxypropyl)sulfamoyl, N,N-dimethylsulfamoyl, N-acetylsulfamoyl, N-benzoylsulfamoyl, N-(N'-phenylcarbamoyl)sulfamoyl), a sulfo group, an alkyl- or aryl-sulfinyl group (preferably a substituted or unsubstituted alkylsulfinyl group having a carbon number of 1 to 30, or a substituted or unsubstituted arylsulfinyl group having a carbon number of 6 to 30, e.g., methylsulfinyl, ethylsulfinyl, phenylsulfinyl, p-methylphenylsulfinyl), an alkyl- or aryl-sulfonyl group (preferably a substituted or unsubstituted alkylsulfonyl group having a carbon number of 1 to 30, or a substituted or unsubstituted arylsulfonyl group having a carbon number of 6 to 30, e.g., methylsulfonyl, ethylsulfonyl, phenylsulfonyl, p-methylphenylsulfonyl), an acyl group (preferably a formyl group, a substituted or unsubstituted alkylcarbonyl group having a carbon number of 2 to 30, or a substituted or unsubstituted arylcarbonyl group having a carbon number of 7 to 30, e.g., acetyl, pivaloylbenzoyl), an aryloxycarbonyl group (preferably a substituted or unsubstituted aryloxycarbonyl group having a carbon number of 7 to 30, e.g., phenoxycarbonyl, o-chlorophenoxycarbonyl, m-nitrophenoxycarbonyl, p-tert-butylphenoxycarbonyl), an alkoxycarbonyl group (preferably a substituted or unsubstituted alkoxycarbonyl group having a carbon number of 2 to 30, e.g., methoxycarbonyl, ethoxycarbonyl, tert-butoxycarbonyl, n-octadecyloxycarbonyl), a carbamoyl group (preferably a substituted or unsubstituted carbamoyl group having a carbon number of 1 to 30, e.g., carbamoyl, N-methylcarbamoyl, N,N-dimethylcarbamoyl, N,N-di-n-octylcarbamoyl, N-(methylsulfonyl)carbamoyl), an aryl- or heterocyclic-azo group (preferably a substituted or unsubstituted arylazo group having a carbon number of 6 to 30, or a substituted or unsubstituted heterocyclic azo group having a carbon number of 3 to 30, e.g., phenylazo, p-chlorophenylazo, 5-ethylthio-1,3,4-thiadiazol-2-yl azo), an imido group (preferably N-succinimido or N-phthalimido), a phosphino group (preferably a substituted or unsubstituted phosphino group having a carbon number of 2 to 30, e.g., dimethylphosphino, diphenylphosphino, methylphenoxyphosphino), a phosphinyl group (preferably a substituted or unsubstituted phosphinyl group having a carbon number of 2 to 30, e.g., phosphinyl, dioctyloxyphosphinyl, diethoxyphosphinyl), a phosphinyloxy group (preferably a substituted or unsubstituted phosphinyloxy group having a carbon number of 2 to 30, e.g., diphenoxyphosphinyloxy, dioctyloxyphosphinyloxy), a phosphinylamino group (preferably a substituted or unsubstituted phosphinylamino group having a carbon number of 2 to 30, e.g., dimethoxyphosphinylamino, dimethylaminophosphinylamino), or a silyl group (preferably a substituted or unsubstituted silyl group having a carbon number of 3 to 30, e.g., trimethylsilyl, tert-butyldimethylsilyl, phenyldimethylsilyl).

Out of the substituents above, those having a hydrogen atom may be deprived of the hydrogen atom and further be substituted with the above-described group. Examples of such a functional group include an alkylcarbonylaminosulfonyl group, an arylcarbonylaminosulfonyl group, an alkylsulfonylaminocarbonyl group, and an arylsulfonylaminocarbonyl group. Examples thereof include methylsulfonylaminocarbonyl, p-methylphenylsulfonylaminocarbonyl, acetylaminosulfonyl, and benzoylaminosulfonyl.

In the formula (I), when a plurality of -$L^1$—groups, or a plurality of —R groups are present in a molecule, they may be the same or different from each other; and P and P, or P and R may bond together.

With respect to specific examples of the liquid crystal polymer of the present invention that is represented by the formula (I), specific examples of the combination of the connecting group D and the -$L^1$—group include a random combination in which the connecting group D is selected from the aforementioned specific examples of (D4), (D16-1) to (D16-5), and (D17-1) to (D17-5), and the -$L^1$—group is selected from the aforementioned aromatic polyester (preferably the structure that is composed of two recurring units represented by the aforementioned formula (A)) and the above-exemplified structures (1) to (19).

The synthetic charge amount of the raw material that forms a connecting group D is preferably less than 30 mol %, and more preferably less than 15 mol %, and especially preferably less than 10 mol %, relative to a total charge amount of the raw material that forms a connecting group D, polymer P, and the raw material that forms a R group. When the charge amount of the raw material that forms a connecting group D becomes too large, the molecular weight per molecule becomes smaller. Resultantly, the thus-formed polymer causes a problem relating to a mechanical strength and the like. Therefore, the charge amount of less than 30 mol % is preferable.

The molecular weight of the liquid crystal polymer of the present invention that is represented by the formula (I) is preferably 10,000 to 1,000,000, and more preferably 20,000 to 500,000 in terms of weight-average molecular weight, in consideration of film properties such as Tg and tensile strength. The weight-average molecular weight can be measured by injecting a liquid crystal polymer solution into a GPS (Gel Permeation Chromatography) to obtain a molecular weight distribution curve, and then correcting the resultant molecular weight distribution curve with standard monodispersion polystyrene, to obtain a polystyrene conversion weight-average molecular weight.

The polymer of the present invention has a liquid crystalline property. The viscosity of the liquid crystal polymer of the present invention at melting is very low. Further, the melt viscosity of the liquid crystal polymer of the present invention reduces at the temperature higher than the transition point temperature to the liquid crystal phase. The ratio of "reduction in viscosity"/"elevation of temperature" of the liquid crystal polymer of the present invention is much larger than those of ordinary crystalline or non crystalline polymers (ordinary crystalline or non crystalline polymers softens at the temperature higher than the glass transition temperature and thereby viscosity reduces). By virtue of the aforementioned characteristics, the liquid crystal polymer of the present invention can be widely used for compact parts (formed article parts) in which high grade heat resistance and microstructure are required.

<Liquid Crystal Polymer Composition>

The composition of the present invention contains the aforementioned liquid crystal polymer. In the composition of the present invention, any kind of frame-retardants such as red phosphorus, brominated organic compounds, and phosphor compounds may be used.

Examples of the brominated organic compounds include compounds that are ordinarily used as a frame-retardant. Especially, those compounds having a bromine content of 20% or more are preferable. Specific examples of the brominated organic compound include low molecular brominated organic compounds such as hexabromobenzene, pentabromotoluene, pentabromobiphenyl, decabromobiphenyl, hexabromocyclodecane, decabromodiphenylether, octabromodiphenylether, hexabromodiphenylether, bis(pentabromophenoxy)ethane, ethylene-bis (tetrabromophthalimide), and tetrabromobisphenol A; brominated polycarbonates (for example, polycarbonate oligomers produced from a brominated bisphenol A as a raw material, or copolymers of the oligomer and bisphenol A); brominated epoxy compounds (for example, diepoxy compounds that are produced by reacting a brominated bisphenol A and epichlorohydrin, epoxy compounds that are produced by reacting a brominated phenol and epichlorohydrin); and halogenated polymers or oligomers, or a mixture thereof such as a poly-brominated benzylacrylate, a brominated polyphenyleneether, a condensate of a brominated bisphenol A, cyanuric chloride and a brominated phenol; a brominated polystyrene (including a poly-brominated styrene), a closslinked brominated polystyrene, and a crosslinked brominated poly α-methylstyrene. Of these compounds, ethylene-bis (tetrabromophthalimide), brominated epoxy oligomers or polymers, a brominated polystyrene, a closslinked brominated polystyrene, a brominated polyphenyleneether, and a brominated polycarbonate are preferable from viewpoints of securement of both compatibility with a blended liquid crystal polymer and flame-retardance of the film that is obtained from the liquid crystal polymer. A brominated polystyrene is particularly preferable.

When the aforementioned flame-retardant is added to the composition, the content of the flame-retardant is preferably 1 to 30 mass parts and more preferably 0.5 to 10 mass parts, relative to 100 mass parts of the liquid crystal polymer.

In the liquid crystal composition according to the present invention, it is preferred to add a release agent for the purpose of improvement of releasability. As the release agent, any release agents can be added; and, of all release agents, olefin-series polymers and/or ester compounds comprised of fatty acid having 11 or more carbon atoms and an aliphatic primary alcohol having 11 or more carbon atoms are preferable from the viewpoints of securement of both compatibility with the liquid crystal polymer and releasability of the film obtained from the liquid crystal polymer.

An olefin-series polymer that may be used in the present invention is at least one polymer selected from the group consisting of polyethylene, polypropylene, copolymers of ethylene or propylene and α-olefin having 3 or more carbon atoms, and copolymers of ethylene or propylene and α-olefin having 3 or more carbon atoms and non-conjugated diene.

As the α-olefin having 3 or more carbon atoms, propylene, butene-1, pentene-1,3-methylpentene-1,octacene-1 and the like may be preferably used. Propylene or butene-1 is more preferable. These olefins may be used in combination of two or more olefins.

As the non-conjugated diene, 5-ethylidene-2-norbornene, dicyclopentadiene, 1,4-hexadiene and the like may be preferably used.

In the case where the non-conjugated diene is not contained, a copolymerization ratio of ethylene and α-olefin having 3 or more carbon atoms is ordinarily "40/60" to "99/1" (molar ratio), and preferably "70/30" to "95/5" (molar ratio).

In the case where the non-conjugated diene is contained, a content of the α-olefin having 3 or more carbon atoms is ordinarily from 3 to 80 mole %, and preferably from 15 to 60 mole %, and a content of the non-conjugated diene is ordinarily from 0.1 to 15 mole %, and preferably from 0.5 to 10 mole %.

Specific examples of these copolymers include ethylene/propylene copolymers, ethylene/butene-1 copolymers, ethylene/pentene-1 copolymers, ethylene/propylene/butene-1copolymers, ethylene/propylene/5-ethylidene-2-norbornene copolymers, ethylene/propylene/1,4-hexadiene copolymers, and ethylene/propylene/dicyclopentadiene copolymers. Of these copolymers, ethylene/propylene copolymers, and ethylene/butene-1 copolymers, each of which is excellent in heat resistance, are more preferable.

Of these olefin-series polymers, polyethylene, and polypropylene are most preferably used. Further, the aforementioned olefin-series polymers may be used in combination of two or more kinds of polymers.

The molecular weight of the olefin-series polymers is not particularly limited, but preferably in the range of 4,000 to 20,000, more preferably 5,000 to 17,000, and most preferably 5,000 to 10,000, in terms of member average molecular weight (Mn). Further, the ratio (Mn/Mw) of number average molecular weight (Mn) to weight average molecular weight (Mw) is preferably in the range of 10 to 40, more preferably 12 to 37, and most preferably 25 to 35.

The molecular weight can be measured according to a GPC-LS (Gel Permeation Chromatograph-Light Scattering) method using a solvent in which polyethylene can be solved.

The carbon number of a fatty acid and an aliphatic primary alcohol, each of which is a component of the ester compound for use in the present invention, is generally 11 or more, and preferably 14 or more. When the carbon number of the fatty acid and aliphatic alcohol to be used in the ester is too small, cracked gas occurs owing to shape forming at high temperature, so that a good shaped product cannot be obtained, which is not preferable. Specific examples of the fatty acid having 11 or more carbon atoms that is used to produce esters include undecylic acid, lauric acid, tridecylic acid, myristic acid, pentadecylic acid, palmitic acid, heptadecylic acid, stearic acid, isostearic acid, nonadecanoic acid, oleic acid, linoleic acid, arachidic acid, behenic acid, lignoceric acid, cerotic acid, heptacosanoic acid, montanic acid, and melissic acid. Of these acids, laurylic acid, stearic acid, oleic acid, arachidic acid, behenic acid, and montanic acid are preferable. Specific examples of the aliphatic primary alcohol having 11 or more carbon atoms include undecanol, dodecanol, tridecanol, tetradecanol, pentadecanol, hexadecanol, heptadecanol, oleyl alcohol, octadecanol, nonadecanol, eicosanol, heneicosanol, tricosanol, tetracosanol, hexacosanol, octacosanol, ethyleneglycol, and butyleneglycol. Of these alcohols, undecanol, hexadecanol, heptadecanol, oleyl alcohol, octacosanol, ethyleneglycol, and butyleneglycol are preferable.

In the composition of the present invention, a content of the releasing agent, for example, olefin-series polymers and/or ester compounds formed from fatty acids having 11 or more carbon atoms and aliphatic primary alcohols having 11 or more carbon atoms, is generally in the range of 0.01 to 2 mass parts, and preferably 0.03 to 1.5 mass parts, relative to 100 mass parts of the liquid crystal polymer. When both the olefin-series polymers and the ester compounds formed from fatty acids having 11 or more carbon atoms and aliphatic primary alcohols having 11 or more carbon atoms are contained in the composition of the liquid crystal polymer, the ratio of these compounds is preferably in the range of "1/9" to "9/1" in consideration of compatibility of these compounds with each other, and also compatibility of these compounds with the liquid crystal polymer. The ratio in the range of "3/7" to "7/3" is more preferable.

Further, to the liquid crystal polymer composition of the present invention, ordinary additives such as antioxidants and heat stabilizers (for example, hindered phenol, hydroquinone, phosphites, and their substituted derivatives), ultraviolet absorbing agents (for example, resorcinol, salicylate, benzotriazole, benzophenone), sliding agents and releasing agents (montanic acid, and its salt, its ester, its half ester; stearyl alcohol, stearamide, polyethylene, polyethylene wax), coloring agents including dyes (for example, nitrosine) and pigments (for example, cadmium sulfide, phthalocyanine, carbon black); compatibility-providing agents such as an epoxy compound and the like; plasticizers, antistatic agents, crystal nucleating agents, flame retardants, and flame retardant aids can be added in such an amount that the additives do not adversely affect the effect of the present invention. Thereby, desirable characteristics can be given to the liquid crystal polymer composition.

As a method of incorporating the flame retardant or other additives to the composition, a melting and kneading method is preferable. Specifically, it is possible to use any one of methods such as a method of melting and kneading additives at the same time as production of the master batch, a method of melting and kneading additives at the same time as the melting and kneading step of both the master batch and the liquid crystal polymer, and a method of melting and kneading both the master batch and the liquid crystal polymer, and thereafter melting and kneading together therewith both the flame retardant (excluding the aforementioned red phosphorus) and the other additives. Any kind of melting and kneading methods can be used to melt and knead the additives. In order to produce the composition, the melting and kneading step can be performed by using, for example, Banbury mixer, rubber roll mill, kneader, single screw or twin screw extruder, and the like.

(Kneading)

The production method of the liquid crystal polymer composition of the present invention is not particularly limited, but it is preferable to produce the composition by a melting and kneading method. Any kind of melting and kneading methods can be used to produce the composition. It is recommended that the melting and kneading step can be performed at a temperature of 200° C. to 400° C. by using, for example, Banbury mixer, rubber roll mill, kneader, single screw or twin screw extruder, and the like.

The liquid crystal polymer composition of the present invention is not only usable in producing a substrate for a flexible printed circuit board, a TAB tape, and an insulating tape, but the composition is also usable, when filled with various kinds of fillers, in producing electric and electronic components represented by various kinds of gear, various kinds of case, sensors, LED lamps, connectors, sockets, resisters, relay cases, switches, coil bobbins, condensers, variable condenser cases, optical pickups, optical connectors, radiators, various types of terminal boards, transformers, plugs, printed circuit boards, tuners, speakers, microphones, headphones, micromotors, magnetic head bases, power modules, housings, semi-conductors, liquid crystal display components, FDD carriages, FDD chassis, HDD components, motor blush holders, parabola antennas, and computer-related components; home and office electric appliances represented by VTR components, TV components, irons, hair dryers, rice cooker components, microwave oven components, acoustic components, audio equipment components (such as, audio, laser disc, and compact disc equipments), illumination components, refrigerator components, air conditioner components, type writer components, and word processor components; machine-related components represented by office computer-related components, telephone equipment-related components, facsimile-related components, copier-related components, separating claws, washing jigs, various bearings (for example, oil less bearing, stern bearing, submerged bearing), motor components, lighters, and type writers; optical instrument and precision instrument-related components represented by microscopes, binoculars, cameras, and watches; automobile and vehicles-related components such as alternator terminals, alternator connectors, IC regulators, various valves (for example, exhaust valves), various kinds of fuel-, exhaust- and admission-pipes, air intake nozzle snorkels, intake manifolds, fuel pumps, engine-cooling water joints, carburetor main bodies, carburetor spacers, exhaust sensors, cooling water sensors, oil temperature sensors, throttle position sensors, crankshaft position sensors, airflow meters, brake pad wear sensors, thermostat bases for air conditioner, hot air flow control valves for heating, brush holders for radiator motor, water pump impellers, turbine panes, wiper motor-related components, distributors, starter switches, starter relays, wire harness for transmission, window washer nozzles, air conditioning panel switch boards, coils for fuel-related electromagnetic valves, fuse connector, horn terminals, electric components-insulating plates, step motor rotors, lamp sockets, lamp reflectors, lamp housings, brake pistons, solenoid bobbins, engine oil filters, and ignition device cases; and various other uses.

Especially, the liquid crystal polymer composition of the present invention has an excellent thin wall flow property, so that electric and electronic components can be sealed with the composition by using an ordinary forming method (e.g., injection molding, press molding). Therefore, it is useful for components that are used to seal discrete components such as IC, transistor, varistor, diode, condenser, thermistor, thyristor, photo coupler, photo reflector, trans coil, rectifying device, resistor, volume variable resistor, power amplifier module, sensor, motor, semi-conductor laser, and optical device, as well as HDD components, FDD components, and CD pickup components.

The liquid crystal polymer composition of the present invention prepared as described above has an excellent forming property, so that the composition can be processed to three dimensional molded components, sheets, and container pipe by using an ordinary forming method (for example, injection molding, extrusion molding, blow molding, press molding, injection press molding). Especially, the composition of the present invention is useful for precise moldings that are obtained by extrusion molding or injection molding.

Particularly, the liquid crystal polymer composition of the present invention is suitable for an insulating layer of semiconductor package board, tapes for COF and TAB, and other insulating tapes, and FPC materials.

<Film>

The film of the present invention contains the aforementioned liquid crystal polymer, and is formed by using the liquid crystal polymer composition.

The constitution of the liquid crystal polymer composition that forms the film of the present invention may be properly changed within the scope of the present invention in accordance with its end use. For example, in order to achieve both desirable heat resistance and process property of the film, it is preferable to select a liquid crystal polymer composition having a melting point within the range of about 200° C. to about 400° C., especially about 250° C. to about 350° C. from the aforementioned range. However, from the viewpoint of film production, a liquid crystal polymer composition having a relatively lower melting point is preferable. Accordingly, when higher heat resistance and melting point are required to the films, it is advantageous to once obtain films and then to subject the obtained films to a heat processing to enhance their heat resistance and melting point up to a desired degree. One example of the heat processing conditions is explained below. Even though the once obtained film has a melting point of 283° C., the melting point of the film can be increased to 320° C., if the film is heated at 260° C. for 5 hours.

The thickness of the liquid crystal polymer film of the present invention is not particularly limited. So, the film embraces 5 mm or less thick plate-like or sheet film. When the film of the present invention is used singly as an electric insulation layer of the flexible board for high-frequency circuit, the thickness of the film is preferably in the range of 10 µm to 150 µm, and more preferably 15 µm to 75 µm. When the thickness of the film is too thin, the rigidity and the strength of the film become weak. Therefore, it is suitable to laminate a plurality of from 10 µm to 150 µm thick films to achieve a desired thickness.

The film that is composed of the liquid crystal polymer composition of the present invention is obtained by extrusion molding the aforementioned main chain type liquid crystal polymer composition. Any kind of extrusion molding method may be applied for the film production. Any kind of biaxial extrusion molding and inflation molding are advantageous in industrial production. Especially in the inflation molding, stress is subjected not only to the machine axis direction (hereinafter, abbreviated to "MD direction") of the film, but also to the orthogonal direction (hereinafter, abbreviated to "TD direction"). Thereby, it is possible to obtain a well balanced film with respective to a mechanical property and a thermal property in both the MD direction and the TD direction.

A liquid crystal film can be advantageously formed by the method of processing a liquid crystal polymer, including steps of heating a liquid crystal film in the state that at least one surface of the film contacts to a support, to melt the liquid crystal polymer; cooling and solidifying the melt polymer to form a polymer layer; and separating the solidified polymer layer from the support (see, for example, JP-A-8-90570).

The film of the present invention has such a characteristic property that film in-plane anisotropy (a difference between the MD direction and the TD direction) is small.

As mentioned above, it is generally considered that the liquid crystal film has a good dimensional stability. However, from the reason that a degree of dimensional change in shape is different between the MD direction and the TD direction, a serious problem arises in the case where a precise moulage (profiling) is required. Such the problem also arises with respect to tensile strength and tear strength. The degree of the problem is much greater than conventional polymer films. At the present condition, the liquid crystal polymers do not fully demonstrate their advantages. In contrast, the anisotropy is so small in the film of the present invention that it is possible to make the best use of the advantages of the liquid crystal polymer films they originally have.

<Laminate Body>

A laminate body can be formed by using the liquid crystal polymer film of the present invention. The laminate body contains, for example, a film layer that is composed of the liquid crystal polymer film of the present invention, and a metallic foil layer that is disposed on at least one surface of the film layer. Herein, the film layer that is composed of the liquid crystal polymer film of the present invention works as an electric insulation layer.

As a material of the metallic foil layer, metals that are used for electric connection are suitable. Examples of the metal include copper, gold, silver, nickel, aluminum, and alloys containing these metals. Examples of the alloy include copper-zinc alloy, copper-nickel alloy, and zinc-nickel alloy. Examples of the especially preferable metallic foil include pure copper, oxygen-free copper, and alloys containing 95 mass % or more of copper and the remaining component such as Fe, Sn, P, Cr, Zr, Zn, or the like. Further, it is possible to use a metal plate or the like in which copper is plated on the surface of the alloys such as 42 Alloy. For example, as the copper foil, it is possible to use any articles that are produced by a rolling process, an electrolysis method, or the like. However, it is preferable to use the copper foil that is produced by the electrolysis method that provides a large surface roughness. The metallic foil may be subjected to a chemical processing such as the acid cleaning that is ordinarily applied to copper foil. The thickness of the metallic foil that can be used is preferably in the range of 4 µm to 100 µm, and more preferably 10 µm to 35 µm, in consideration of both electrical conductivity and economy.

In order to produce the laminate body that is composed of the liquid crystal polymer film and the metallic foil, it is possible to use various methods such as a method of bonding these films with an epoxide-based adhesive, a method of directly forming a metallic layer on the film by vapor deposition, spattering, plating, or the like, or a method of performing thermo compression bonding by using a vacuum press apparatus.

In the case where the laminate body of the present invention is applied to a flexible board for a high frequency circuit, it is possible to use a processing method such as a drill processing, or a laser processing with a laser such as carbon dioxide gas laser, YAG laser, ultraviolet laser, or Eximer laser, in order to form a through hole in the board. It is preferable to chemically remove, with a general purpose commercial agent, a cutting scrap (smear) of the main-chain type liquid crystal polymer attached on the hole owing to heat generation at the time when the through hole is formed. Further, it is possible to use any kind of method by which the through hole of the board is plated. For example, a pattern plating and/or a panel plating consisting of both electroless copper plating and electrolyte copper plating may be performed in series.

The present invention provides a liquid crystal polymer that is able to produce a film of which the in-plane anisotropy (a difference between the MD direction and the TD direction) is small.

The liquid crystal polymer of the present invention displays low fluidity reduction, and thereby it is possible to produce a film of which the in-plane anisotropy (a difference between the MD direction and the TD direction) is small.

The present invention will be described in more detail based on the following examples, but the invention is not intended to be limited thereto.

EXAMPLES

Example 1

(Preparation of Liquid Crystal Polymer (A))

4-Hydroxybenzoic acid (187.5 mass parts), 6-hydroxy-2-naphthoic acid (94.5 mass parts), hexahydroxytriphenylene dihydrate (1.99 mass parts), acetic acid anhydride (208.5 mass parts), and potassium acetate (0.01 mass parts) were placed in a reaction vessel, followed by increasing a temperature up to 150° C. with agitation, and then air in the vessel was fully substituted with nitrogen. Further, the temperature was increased up to 330° C. with agitation, and the pressure in the vessel was gradually reduced while removing acetic acid generated during reaction. Agitation was continued for 1 hour at this condition, thereby to prepare liquid crystal polymer (A).

With respect to the thus-prepared liquid crystal polymer (A), observation of a liquid crystal phase was performed with a polarizing microscope. As a result, it was found that the polymer was in the state of liquid crystal at 350° C.

The recurring units of the liquid crystal polymer can be determined by hydrolysis of the polymer into monomer components thereof. The relative proportions (molar ratio) of the liquid crystal polymer (A) were as follows.

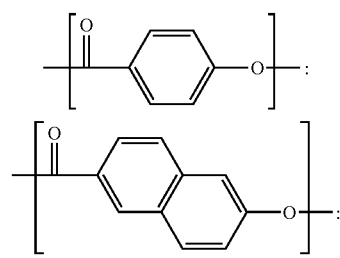

-continued

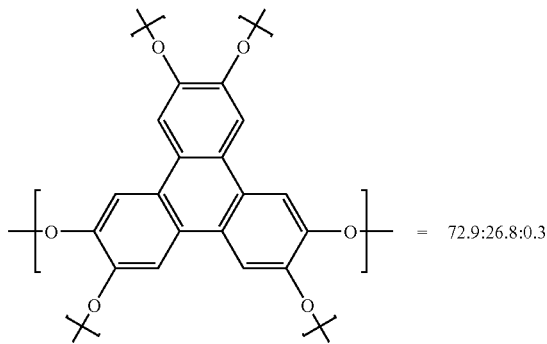

= 72.9:26.8:0.3

By the GPS measurement of the liquid crystal polymer (A), it was confirmed that the molecular weight of the polymer was 35,000.

Example 2

(Preparation of Liquid Crystal Polymer (B))

Liquid crystal polymer (B) was prepared in the same manner as in Example 1, except that hexahydroxytriphenylene dihydrate was replaced by compound (X) having the following structure.

Compound (X)

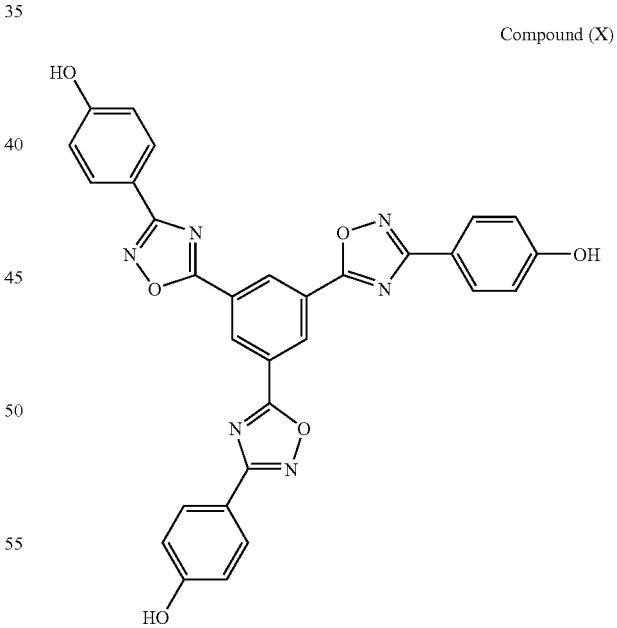

With respect to the thus-prepared liquid crystal polymer (B), observation of a liquid crystal phase was performed with a polarizing microscope. As a result, it was found that the polymer was in the state of liquid crystal at 350° C. The relative proportions (molar ratio) of the recurring units of the liquid crystal polymer (B) that were determined by the same method as in Example 1 are as follows.

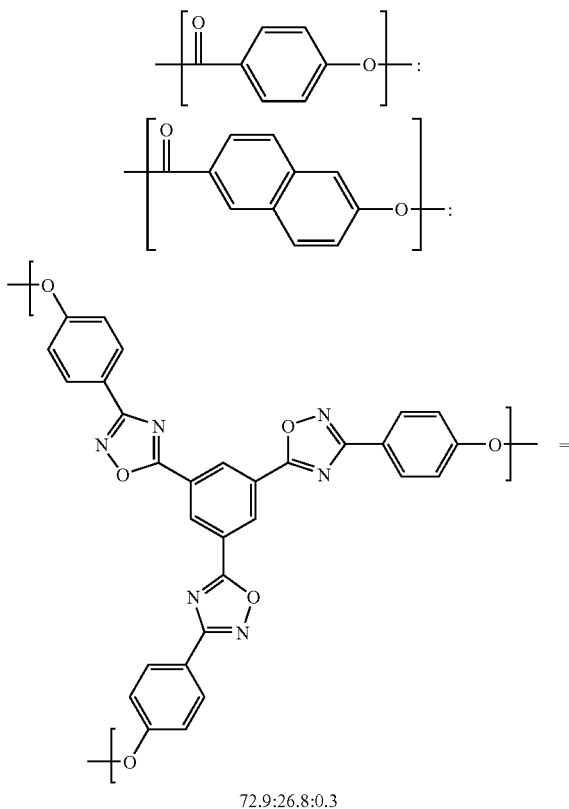

72.9:26.8:0.3

By the GPS measurement of the liquid crystal polymer (B), it was confirmed that the molecular weight of the polymer was 53,000.

Example 3

(Preparation of Liquid Crystal Polymer (C))

Liquid crystal polymer (C) was prepared in the same manner as in Example 1, except that hexahydroxytriphenylene dihydrate was replaced by compound (Y) having the following structure.

Compound (Y)

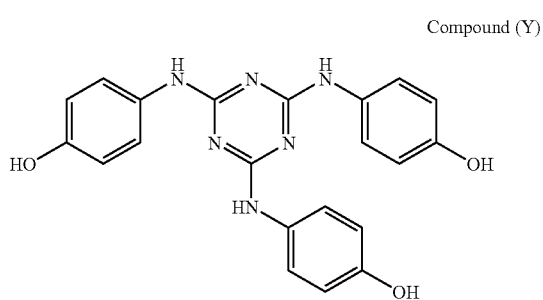

With respect to the thus-prepared liquid crystal polymer (C), observation of a liquid crystal phase was performed with a polarizing microscope. As a result, it was found that the polymer was in the state of liquid crystal at 350° C. The relative proportions (molar ratio) of the recurring units of the liquid crystal polymer (C) that were determined by the same method as in Example 1 are as follows.

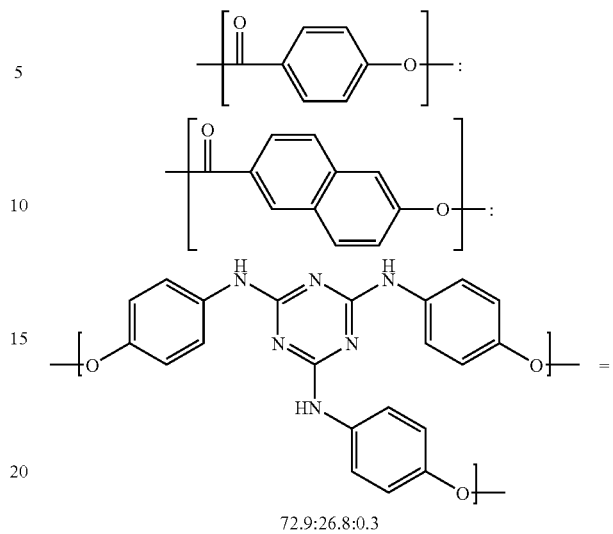

72.9:26.8:0.3

By the GPS measurement of the liquid crystal polymer (C), it was confirmed that the molecular weight of the polymer was 27,000.

Example 4

(Preparation of Liquid Crystal Polymer (D))

90 mass parts of Liquid crystal polymer A 6000 (trade name, manufactured by Ueno Fine Chemicals Industry) and 10 mass parts of the liquid crystal polymer (A) prepared in Example 1 were kneaded by using a twin screw extruder, followed by strand-cutting, thereby to obtain a liquid crystal polymer (D) in a pellet form.

With respect to the thus-prepared liquid crystal polymer (D), observation of a liquid crystal phase was performed with a polarizing microscope. As a result, it was found that the polymer was in the state of liquid crystal at 350° C.

Comparative Example 1

(Preparation of Liquid Crystal Polymer (E))

4-Hydroxybenzoic acid (187.5 mass parts), 6-hydroxy-2-naphthoic acid (94.5 mass parts), acetic acid anhydride (208.5 mass parts), and potassium acetate (0.01 mass parts) were placed in a reaction vessel, followed by increasing a temperature up to 150° C. with agitation, and then air in the vessel was fully substituted with nitrogen. Further, the temperature was increased up to 330° C. with agitation, and the pressure in the vessel was gradually reduced while removing acetic acid generated during reaction. Agitation was continued for 1 hour at this condition, thereby to prepare comparative liquid crystal polymer (E).

With respect to the thus-prepared liquid crystal polymer (E), observation of a liquid crystal phase was performed with a polarizing microscope. As a result, it was found that the polymer was in the state of liquid crystal at 350° C. The relative proportions (molar ratio) of the recurring units of the liquid crystal polymer (E) were as follows.

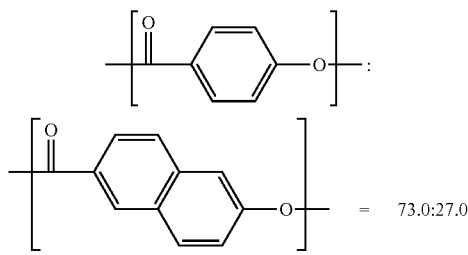

= 73.0:27.0

Examples 5 to 8 and Comparative Example 2

(Production of Liquid Crystal Polymer Films)

The liquid crystal polymer (A) was formed to a 25 μm thick film by an inflation forming process, thereby to produce liquid crystal polymer film (A-1). The liquid crystal polymers (B) to (E) were formed into the corresponding films in the same manner as the liquid crystal polymer film (A-1), thereby to produce liquid crystal polymer films (B-1) to (E-1) respectively. With respect to each of these films, tensile strength was examined.

(Tensile Strength)

The tensile strength of each of the films was measured in accordance with ASTMD 882. Measurement was performed in both MD direction and TD direction, to obtain MD/TD ratios of the observed values.

TABLE 2

| | Liquid Crystal Polymer | Liquid Crystal Polymer Film | Tensile strength (MD/TD) |
|---|---|---|---|
| Example 5 | (A) | (A-1) | 1.15 |
| Example 6 | (B) | (B-1) | 1.18 |
| Example 7 | (C) | (C-1) | 1.20 |
| Example 8 | (D) | (D-1) | 1.30 |
| Comparative Example 2 | (E) | (E-1) | 1.45 |

As is apparent from the results of Table 2, it was found that the liquid crystal polymer films (A-1) to (D-1) that were produced by using the liquid crystal polymers (A) to (D) of the present invention are smaller in terms of MD/TD ratio than the liquid crystal polymer film (E-1) that was produced by using the liquid crystal polymer (E) for comparison. From the above results, it is understood that the films of the present invention display small film in-plane anisotropy.

Examples 9 to 12 and Comparative Example 3

(Production of Liquid Crystal Polymer Films)

The liquid crystal polymer (A) was formed to a 25 μm thick film by film forming by a melt, thereby to produce liquid crystal polymer film (A-2). The liquid crystal polymers (B) to (E) were formed into the corresponding films in the same manner as the liquid crystal polymer film (A-2), thereby to produce liquid crystal polymer films (B-2) to (E-2) respectively. With respect to each of these films, tensile strength was examined in the same manner as described in the above.

TABLE 3

| | Liquid Crystal Polymer | Liquid Crystal Polymer Film | Tensile strength (MD/TD) |
|---|---|---|---|
| Example 9 | (A) | (A-2) | 1.28 |
| Example 10 | (B) | (B-2) | 1.30 |
| Example 11 | (C) | (C-2) | 1.33 |
| Example 12 | (D) | (D-2) | 1.40 |
| Comparative Example 3 | (E) | (E-2) | 2.25 |

As is apparent from the results of Table 3, it was found that the liquid crystal polymer films (A-2) to (D-2) that were produced by using the liquid crystal polymers (A) to (D) of the present invention are smaller in terms of MD/TD ratio than the liquid crystal polymer film (E-2) that was produced by using the liquid crystal polymer (E) for comparison. From the above results, it is understood that the films of the present invention display small film in-plane anisotropy.

Examples 13 to 16 and Comparative Example 4

(Production of Flexible Board)

A 18 μm thick electrolytic copper foil (surface roughness 11 μm) was superposed on each of the liquid crystal polymer films (A-1) to (E-1), and the thus-superposed films were supplied between pressure rollers so that a silicone rubber roller having a hardness of 90 degrees would contact the film side, while a chromium-plated iron roller would contact the copper foil side. The thermal compression bonding was performed under the conditions of surface temperature 250° C., surface pressure 25 Kg/cm$^2$, line pressure 38 Kg/cm, line speed 1 m/min, each of which was applied to the chromium-plated iron roller, thereby to obtain a laminate body. Characteristic properties of the thus-obtained laminate bodies were examined as set forth below.

(Solder Dip Resistance)

A test specimen of 2.5 cm×2.5 cm that was cut from each of the laminate bodies was dipped for 10 seconds in a solder bath of 260° C. Thereafter, swollenness and peeling were observed by naked eye.

Criterion

A: No swollenness and no peeling were observed.
B: Swollenness and/or peeling were observed.

(Flex Resistance)

At the copper foil side of the laminate bodies composed of the copper foil and any one of the liquid crystal polymer films (A-1) to (E-1), the same pattern as the JPCA standard flexure endurance-testing specimen was formed according to an ordinary method (see FIG. 1). Namely, at the copper foil side of the laminate bodies, a photo resist solution was coated according to a spin coat method so that a thickness of the coating became uniform. After removal of the solvent, an original exposure plate (master) having the same pattern as the JPCA standard flexural endurance-testing specimen of the single-sided flexible printed wiring board was made stick together on the formed photo resist film. Thereafter, ultraviolet ray was exposed from the backside of the original exposure plate (master) to print a pattern on the photo resist film disposed at the surface of the copper foil. Subsequently, the non-exposed portion of the photo resist film was dissolved and removed, and then the photo resist film was soaked in a solution containing 400 g/liter of ferric chloride at 40° C. for 20 minutes, to dissolve only a copper foil disposed on the non-pattern portion.

Figure 2:
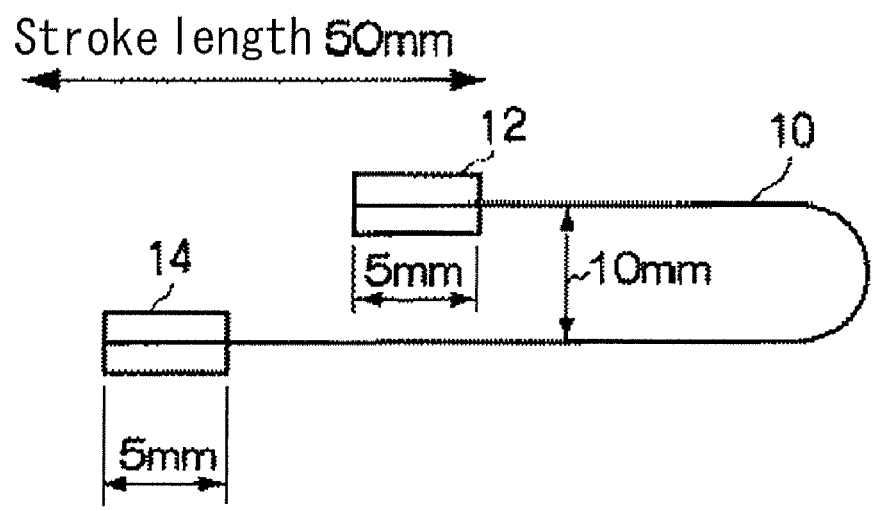
FIG. 2 is a schematic view showing the outline of forced flexibility test method.

Using the testing specimen prepared according to the above-described method, mandatory flex resistance testing was performed according to the method illustrated in FIG. 2. The portion within the distance of 5 mm from one end of the testing specimen of 25 mm×180 mm was clipped with a fixed holding assembly 12 (this end of the film is referred to as a fixed end). The portion within the distance of 5 mm from another end of the testing specimen was clipped with a mobile holding assembly 14 at the state where the film was flexed so that a bending radius of the flexural area became 10 mm (this end of the film is referred to as a moving end). The moving end was reciprocated parallel to the fixed end at the state that the bending radius was kept to 10 mm, and at the stroke length of 50 mm so that the center portion of the film and its neighborhood would be bent. After the moving end was reciprocated 1,000 times, a degree of lift at the pattern-forming metallic foil portion was observed by naked eye. Evaluation was performed according to the criterion set forth below. The results are shown in Table 4.

Criterion
A: No lift was observed.
B: A little lift was observed at the corner portion, but no lift was observed at the straight portion.
C: A lift was observed at the corner portion, and a little lift was observed at the straight portion.
D: A lift was observed at the corner portion, and a lift was observed at the straight portion.

TABLE 4

|  | Liquid Crystal Polymer Film | Solder Dip Resistance | Flex Resistance |
|---|---|---|---|
| Example 13 | (A-1) | A | A |
| Example 14 | (B-1) | A | A |
| Example 15 | (C-1) | A | A |
| Example 16 | (D-1) | A | A |
| Comparative Example 4 | (E-1) | A | A |

As is apparent from the results of Table 4, it was found that the flexible boards that were obtained from the liquid crystal polymer films of the present invention showed excellent properties in terms of solder dip resistance and flex resistance.

The above-described results can be summarized as follows.

As is apparent from Tables 2 and 3, the MD/TD ratio of tensile strength in the liquid crystal polymer films of the present invention is smaller than the films of Comparative Examples 2 and 3. This means that anisotropy of the liquid crystal polymer films of the present invention has been improved to a large extent. As is apparent especially from Table 3, even in the film forming by a melt by which anisotropy of film generally tends to increase, anisotropy is considerably improved by use of the liquid crystal polymer of the present invention. Further, as is apparent from Table 4, the flexible boards that were obtained from the liquid crystal polymer films of the present invention show excellent properties in terms of solder dip resistance and flex resistance.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2008-074639 filed in Japan on Mar. 21, 2008, which is entirely herein incorporated by reference.

What is claimed is:
1. A liquid crystal polymer represented by the following formula (I):

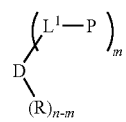

Formula (I)

wherein D represents a n-valence connecting group; n represents an integer of 3 to 20; $L^1$ represents a single bond or a bivalent connecting group; P represents a polymer having at least one ester bond and/or amide bond and having a weight-average molecular weight of 1,000 or more; m represents an integer that satisfies the relation of n≧m; R represents a hydrogen atom or a substituent; when a plurality of $L^1$, a plurality of P, or a plurality of R are present in a molecule, they may be the same or different from each other; and P and P, or P and R may bond together, wherein P in formula (I) is a polymer having at least one recurring unit selected from the recurring unit group set forth below and having at least one ester bond and/or amide bond:

(Recurring unit group)

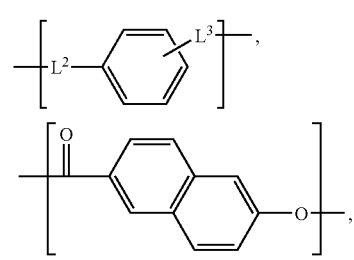

Formula (P1)

Formula (P2)

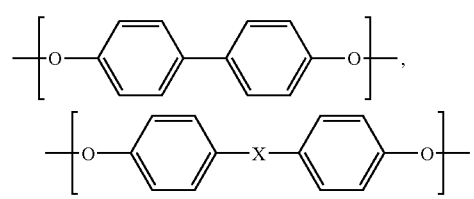

wherein, in formula (P1), $L^2$ and $L^3$ each independently represents a connecting group selected from the group consisting of —O—, —NH—, —CO—, —COO(CH$_2$)$_2$O—, —COO(CH$_2$)$_4$O—, and —COO(CH$_2$)$_2$CH(CH$_3$)O—; the location of $L^3$ is a para-position or a meta-position, relative to $L^2$; and wherein, in formula (P2), X represents a connecting group selected from the group consisting of —O—, —C(CH$_3$)$_2$—, and —SO$_2$—, wherein $L^1$ in the formula (I) is any one of the following bivalent connecting groups:

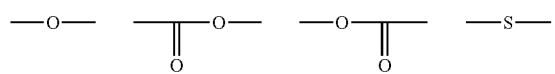

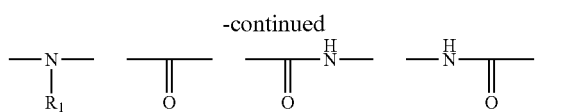

wherein $R^1$ represents a hydroxyl group, a methyl group, or an ethyl group, wherein D in the formula (I) is a connecting group represented by any one of the following formulae (D-I) to (D-III):

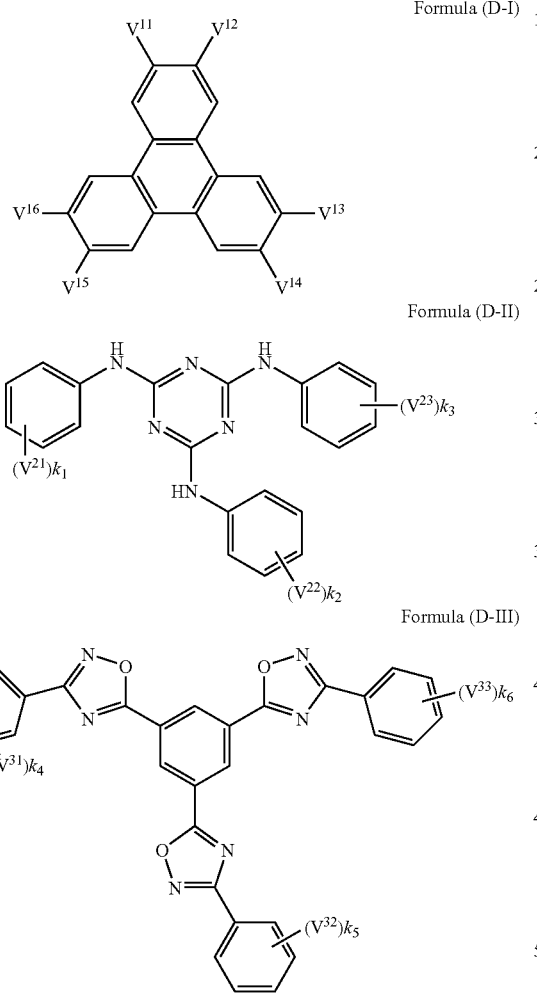

wherein in formula (D-I), $V^{11}$ to $V^{16}$ each independently represents a -$L^1$-P group or —R group in the polymer of formula (I), a hydroxyl group, or an acyloxy group; and the connecting group represented by formula (D-I) has $m^1$ number of the -$L^1$-P group in the polymer of formula (I) and has ($n^1$-$m^1$) number of the —R group in the polymer of formula (I), in which $n^1$ represents an integer of 3 to 6, and $m^1$ represents an integer that satisfies the relation of $n^1 \geqq m^1$;

wherein, in formula (D-II), $V^{21}$ to $V^{23}$ each independently represents a -$L^1$-P group or —R group in the polymer of formula (I), a hydroxyl group, an acyloxy group, an alkoxycarbonyl group, an amino group, or an acylamino group; $k_1$, $k_2$, and $k_3$ each independently represents an integer of 0 to 5; and the connecting group represented by formula (D-II) has $m^2$ number of the -$L^1$-P group in the polymer of formula (I) and has ($n^2$-$m^2$) number of the —R group in the polymer of formula (I), in which $n^2$ represents an integer of 3 to 15, and $m^2$ represents an integer that satisfies the relation of $n^2 \geqq m^2$;

wherein, in formula (D-III), $V^{31}$ to $V^{33}$ each independently represents a -$L^1$-P group or —R group in the polymer of formula (I), a hydroxyl group, an acyloxy group, an alkoxycarbonyl group, an amino group, or an acylamino group; $k_4$, $k_5$ and $k_6$ each independently represents an integer of 0 to 5; and the connecting group represented by formula (D-III) has $m^3$ number of the -$L^1$-P group in the polymer of formula (I) and has ($n^3$-$m^3$) number of the —R group in the polymer of formula (I), in which $n^3$ represents an integer of 3 to 15, and $m^3$ represents an integer that satisfies the relation of $n^3 \geqq m^3$.

2. The liquid crystal polymer as claimed in claim 1, wherein R in the formula (I) is selected from the group consisting of a hydrogen atom, a hydroxyl group, a carboxyl group, an acyloxy group, an alkoxycarbonyl group, an amino group, and an acylamino group.

3. A composition containing the liquid crystal polymer as claimed in claim 1.

4. A film containing the liquid crystal polymer as claimed in claim 1.

5. The liquid crystal polymer as claimed in claim 1, wherein the weight average molecular weight of polymer P is 10,000 to 200,000.

6. The liquid crystal polymer as claimed in claim 1, wherein the weight average molecular weight of polymer P is 20,000 to 100,000.

7. The liquid crystal polymer as claimed in claim 1, wherein the weight average molecular weight of the liquid crystal polymer represented by formula (I) is 10,000 to 1,000,000.

8. The liquid crystal polymer as claimed in claim 1, wherein the weight average molecular weight of the liquid crystal polymer represented by formula (I) is 20,000 to 500,000.

9. The liquid crystal polymer as claimed in claim 1, wherein the polymer P is a main chain type liquid crystal polymer.

10. The liquid crystal polymer as claimed in claim 1, wherein the polymer P is an aromatic polyester or an aromatic polyamide.

11. The liquid crystal polymer as claimed in claim 1, wherein the connecting group represented by $L^2$ is —O— and the connecting group represented by $L^3$ is —CO—.

12. The liquid crystal polymer as claimed in claim 1, wherein the recurring unit is formula (P1) or the following formula:

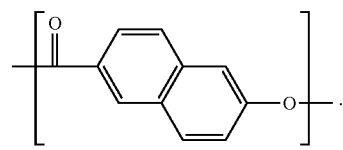

13. The liquid crystal polymer as claimed in claim 1, wherein the recurring unit is formula (P1) and the following formula:

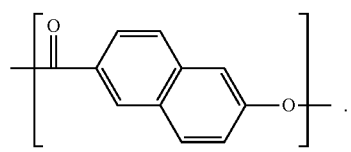
14. The liquid crystal polymer as claimed in claim 1, wherein the liquid crystal polymer represented by formula (I) is prepared by using a raw material that forms a connecting group D of less than 30 mol %, relative to a total charge amount of a raw material that forms a connecting group D, polymer P, and a raw material that forms a R group.
* * * * *